United States Patent
Yasutake et al.

(10) Patent No.: US 12,293,935 B2
(45) Date of Patent: May 6, 2025

(54) SUBSTRATE PROCESSING APPARATUS

(71) Applicant: SCREEN Holdings Co., Ltd., Kyoto (JP)

(72) Inventors: Yosuke Yasutake, Kyoto (JP); Hiroaki Ishii, Kyoto (JP); Wataru Sakai, Kyoto (JP); Yutaka Ikegami, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 455 days.

(21) Appl. No.: 17/778,895

(22) PCT Filed: Nov. 5, 2020

(86) PCT No.: PCT/JP2020/041381
§ 371 (c)(1),
(2) Date: May 23, 2022

(87) PCT Pub. No.: WO2021/106515
PCT Pub. Date: Jun. 3, 2021

(65) Prior Publication Data
US 2022/0415697 A1    Dec. 29, 2022

(30) Foreign Application Priority Data

Nov. 27, 2019    (JP) ................................. 2019-214003

(51) Int. Cl.
*H01L 21/683*    (2006.01)
*H01L 21/687*    (2006.01)

(52) U.S. Cl.
CPC .... *H01L 21/6838* (2013.01); *H01L 21/68742* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 6,146,463 A | * | 11/2000 | Yudovsky | H01L 21/68 118/728 |
| 10,777,404 B2 | * | 9/2020 | Kaba | H01L 21/67 |

(Continued)

FOREIGN PATENT DOCUMENTS

| | | |
|---|---|---|
| JP | H10-092912 A | 4/1998 |
| JP | H10-303110 A | 11/1998 |

(Continued)

OTHER PUBLICATIONS

Machine Generated English Translation of Bib sheet/abstract of WO 2009/104568 (Year: 2009).*

(Continued)

*Primary Examiner* — Sylvia MacArthur
(74) *Attorney, Agent, or Firm* — OSTROLENK FABER LLP

(57) ABSTRACT

The substrate processing apparatus includes a suction holding mechanism, a rotation mechanism, a plurality of lift pins, a vertical movement mechanism, and a horizontal movement mechanism. The suction holding mechanism sucks and holds a substrate. The rotation mechanism rotates the suction holding mechanism holding the substrate about the rotation axis. The vertical movement mechanism moves the plurality of lift pins in the vertical direction. A sensor measures the eccentric state of the substrate W held by the suction holding mechanism. The vertical movement mechanism supports the substrate from the suction holding mechanism by moving the plurality of lift pins and the horizontal movement mechanism moves the plurality of lift pins based on the eccentric state of the substrate measured by the sensor in a state where the substrate is supported.

8 Claims, 13 Drawing Sheets

(56) References Cited

U.S. PATENT DOCUMENTS

| | | | |
|---|---|---|---|
| 2007/0012339 A1 | 1/2007 | Fukuda | |
| 2008/0056857 A1 | 3/2008 | Hiroki | |
| 2011/0281376 A1 | 11/2011 | Amano | |
| 2011/0282484 A1 | 11/2011 | Amano | |
| 2013/0220551 A1 | 8/2013 | Saito | |
| 2019/0067043 A1 | 2/2019 | Uemura | |
| 2022/0415697 A1* | 12/2022 | Yasutake | H01L 21/68764 |

FOREIGN PATENT DOCUMENTS

| | | |
|---|---|---|
| JP | 2009-194346 A | 8/2009 |
| JP | 2010-182966 A | 8/2010 |
| JP | 2011-124298 A | 6/2011 |
| JP | 2011-258924 A | 12/2011 |
| JP | 2011-258925 A | 12/2011 |
| JP | 2012-195427 A | 10/2012 |
| JP | 2017-069414 A | 4/2017 |
| JP | 2018-157039 A | 10/2018 |
| JP | 2019-149423 A | 9/2019 |
| KR | 10-2013-0095290 A | 8/2013 |
| TW | 200631089 A | 9/2006 |
| WO | WO 2008/029608 A1 | 3/2008 |
| WO | WO 2009/084406 A1 | 7/2009 |
| WO | WO 2009/104568 A1 | 8/2009 |
| WO | WO 2012/046397 A1 | 4/2012 |

OTHER PUBLICATIONS

Machine Generated English Translation of Description of WO JP2009-194346. (Year: 2009).*
Machine Generated English Translation of Claims of WO JP2009-194346. (Year: 2009).*
Machine Generated English Translation of Bib sheet/abstract of JP 2010-182966 (Year: 2010).*
Machine Generated English Translation of Description of JP 2010-182966 (Year: 2010).*
Machine Generated English Translation of claims of JP 2010-182966 (Year: 2010).*
Machine Generated English Translation of Claims of JP2012-195427 (Year: 2012).*
Machine Generated English Translation of Abstract of JP2012-195427 (Year: 2012).*
Machine Generated English Translation of Specification of JP2012-195427 (Year: 2012).*
Request for the Submission of an Opinion dated Sep. 25, 2023 in corresponding Korean Patent Application No. 10-2022-7017851 and a computer generated English translation obtained from the JPO.
International Preliminary Report on Patentability and Written Opinion dated Jun. 9, 2022 in corresponding International Application No. PCT/JP2020/041381 with English translation.
International Search Report mailed Feb. 9, 2021 in corresponding PCT International Application No. PCT/JP2020/041381.
Written Opinion mailed Feb. 9, 2021 in corresponding PCT International Application No. PCT/JP2020/041381.
Office Action and Search Report dated Aug. 6, 2021 in corresponding Taiwanese Patent Application No. 109138965 with partial English translation based on the Japanese translation of the original communication.
Taiwanese Decision of Refusal dated Mar. 8, 2022 in corresponding Taiwanese Patent Application No. 109138965 with partial English translation based on the Japanese translation of the original communication.
Request for the Submission of an Opinion dated Feb. 12, 2024 in corresponding Korean Patent Application No. 10-2022-7017851 and a computer generated English translation obtained from the Global Dossier.
Notice of Reasons for Refusal dated Jul. 11, 2023 in corresponding Japanese Patent Application No. 2019-214003 and a computer generated English translation obtained from the JPO.
Notice of Reasons for Refusal dated Nov. 28, 2023 in corresponding Japanese Patent Application No. 2019-214003 and a computer generated English translation obtained from the JPO.

* cited by examiner

F I G. 15
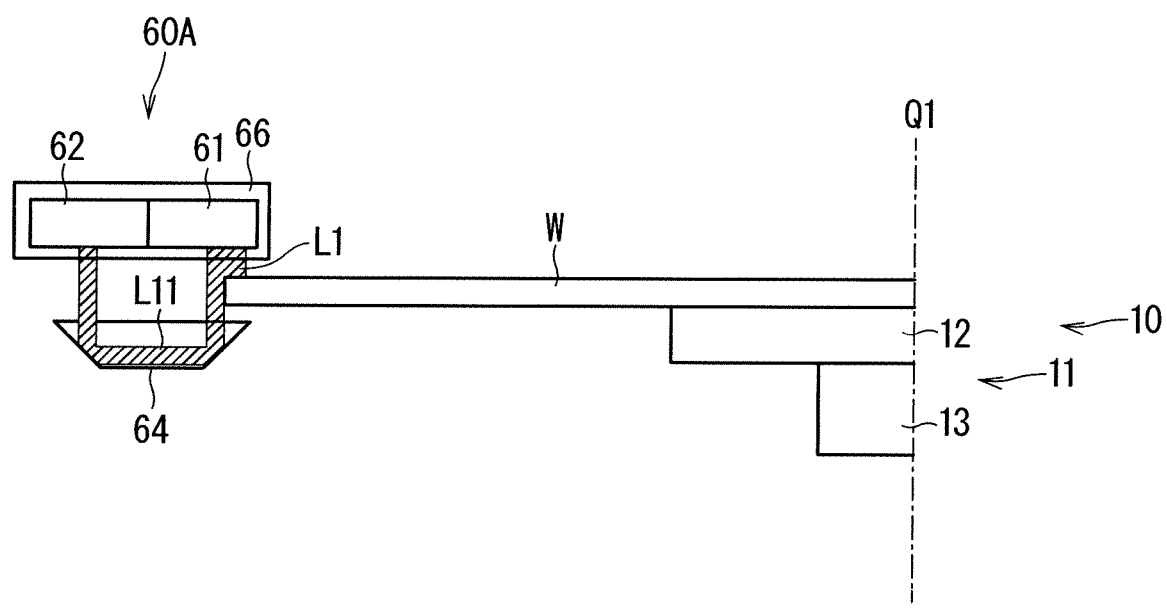

SUBSTRATE PROCESSING APPARATUS

CROSS-REFERENCE TO RELATED APPLICATIONS

The present application is a 35 U.S.C. §§ 371 national phase conversion of International Application No. PCT/JP2020/041381, filed Nov. 5, 2020, which claims priority to Japanese Patent Application No. 2019-214003, filed Nov. 27, 2019, the contents of both of which are incorporated herein by reference. The PCT International Application was published in the Japanese language.

TECHNICAL FIELD

The present application relates to a substrate processing apparatus.

BACKGROUND ART

A substrate processing apparatus for processing the substrate with a disk-shaped substrate held horizontally and being rotated about a vertical rotation axis that passes through the center of the substrate has been conventionally proposed (for example, Patent Documents 1 to 3). These substrate processing apparatuses include a vacuum chuck portion that sucks the lower surface of the substrate, a rotating unit that rotates the vacuum chuck unit about the rotation axis, and a positioning mechanism for adjusting the position of the substrate. The positioning mechanism slides the substrate with respect to the vacuum chuck unit by pushing the end portion of the substrate mounted on the vacuum chuck unit in the horizontal direction, and aligns the center of the substrate with the rotation axis. Consequently, the substrate rotates about the rotation axis that passes through the center thereof.

PRIOR ART DOCUMENTS

Patent Documents

[Patent Document 1] Japanese Patent Application Laid-Open No. 2011-258924
[Patent Document 2] Japanese Patent Application Laid-Open No. 2011-258925
[Patent Document 3] Japanese Patent Application Laid-Open No. 2019-149423

SUMMARY

Problem to be Solved by the Invention

In Patent Documents 1 to 3, the positioning mechanism slides the substrate with respect to the vacuum chuck unit and this may cause damage to or contaminate the lower surface of the substrate.

Therefore, an object of the present application is to provide a substrate processing apparatus that reduces damage to or contamination on the lower surface of a substrate and reduces the eccentric state of the substrate.

Means to Solve the Problem

A first aspect of the substrate processing apparatus is a substrate processing apparatus for processing a substrate, that includes a suction holding mechanism configured to suck a back surface of the substrate and hold the substrate horizontally, a rotation mechanism configured to rotate the suction holding mechanism holding the substrate about a rotation axis passing through a center of the substrate in a vertical direction, a plurality of lift pins provided in positions opposite to the substrate below the substrate held by the suction holding mechanism, a vertical movement mechanism configured to move upper ends of the plurality of lift pins between a first position being higher than a suction surface of the suction holding mechanism and a second position being lower than the suction surface of the suction holding mechanism, a horizontal movement mechanism configured to move the plurality of lift pins in a horizontal direction with respect to the suction holding mechanism, and a sensor configured to measure an eccentric state of the substrate held by the suction holding mechanism, in which the vertical movement mechanism is configured to support the substrate from the suction holding mechanism by moving the plurality of lift pins to the first position, and the horizontal movement mechanism is configured to move the plurality of lift pins based on the eccentric state of the substrate measured by the sensor in a state where the substrate is supported.

A second aspect of the substrate processing apparatus is a substrate processing apparatus according to the first aspect, in which the rotation mechanism is coupled to a shaft extending downward from the suction holding mechanism, and the vertical movement mechanism and the horizontal movement mechanism are coupled to a storing member for storing the rotation mechanism.

A third aspect of the substrate processing apparatus is a substrate processing apparatus according to the second aspect, in which the vertical movement mechanism and the horizontal movement mechanism are provided on an upper surface portion of the storing member.

A fourth aspect of the substrate processing apparatus is a substrate processing apparatus according to any one of the first to third aspects, in which the plurality of lift pins are coupled to each other and integrally move.

A fifth aspect of the substrate processing apparatus is a substrate processing apparatus according to any one of the first to fourth aspects, in which the plurality of lift pins are arranged at equal intervals on a virtual circle centered on the rotation axis.

A sixth aspect of the substrate processing apparatus is a substrate processing apparatus according to any one of the first to fifth aspects, in which the plurality of lift pins located in an annular region interposed between a virtual inner circle having a diameter of one-fourth of a diameter of the substrate held by the suction holding mechanism and a virtual outer circle having a diameter of three-quarters of the diameter of the substrate in plan view.

A seventh aspect of the substrate processing apparatus is a substrate processing apparatus according to any one of the first to sixth aspects, in which the plurality of lift pins are located outside the suction holding mechanism in plan view.

An eighth aspect of the substrate processing apparatus is a substrate processing apparatus according to any one of the first to sixth aspects, in which through holes penetrated by the plurality of lift pins in a vertical direction are formed on the suction holding mechanism.

A ninth aspect of the substrate processing apparatus is a substrate processing apparatus according to any one of the first to sixth aspects, in which the suction holding mechanism has an annular shape surrounding the rotation axis, and the plurality lift pins are located inside the suction holding mechanism in plan view.

A tenth aspect of the substrate processing apparatus is a substrate processing apparatus according to any one of the first to ninth aspects, in which a suction port configured to suck the substrate is formed at the upper end of at least one of the plurality of lift pins.

Effects of the Invention

According to the substrate processing apparatus, damage to or contamination on the lower surface of the substrate is reduced and the eccentric state of the substrate is reduced.

BRIEF DESCRIPTION OF DRAWINGS

FIG. 15 A diagram schematically illustrating an example of a configuration of a sensor 60A.

DESCRIPTION OF EMBODIMENT(S)

Figure 1:
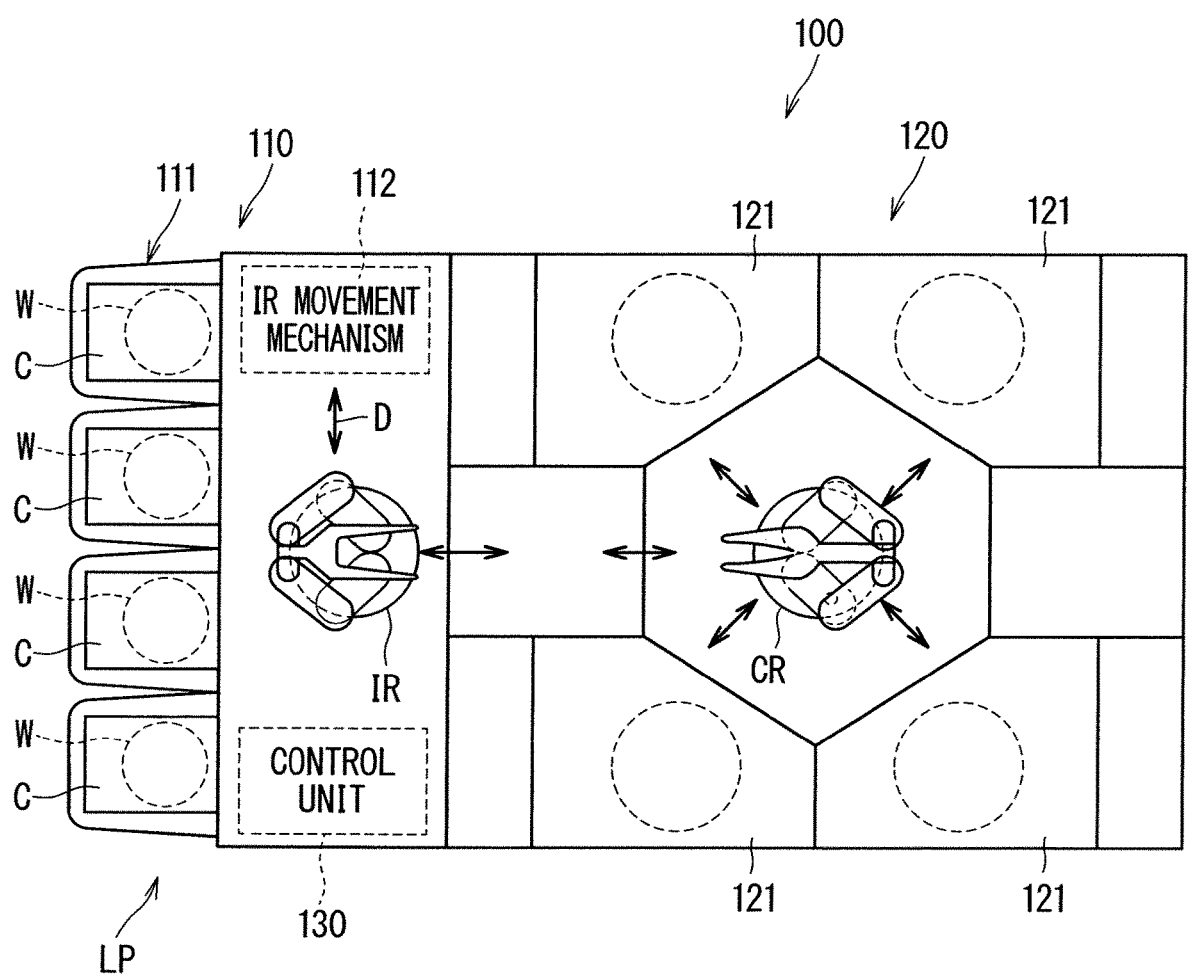
FIG. 1 A plan view schematically illustrating an example of an overall configuration of a substrate processing system.

The embodiments will be described with reference to the drawings. It should be noted that the components described in the embodiments are merely examples, and the scope of the present disclosure is not limited thereto. In the drawings, the dimensions and numbers of each part may be exaggerated or simplified as necessary for easy understanding.

Terms that express the relative or absolute positional relationship (for example, "in one direction" "along one direction", "parallel", "orthogonal", "center", "concentric", "coaxial", etc.) express not only the precise positional relationship, but also express a state of being displaced relative to an angle or distance to the extent that tolerance or similar functionality is obtained, unless otherwise specified. Terms that express the state of being equal (for example, "same", equal", homogeneous", etc.) express not only the state of being exactly equal quantitative-wise, but also express a state involving tolerance or differences with which similar functionality is obtained. Terms that express shapes (for example, "square" or "cylindrical") not only precisely express the shapes geometrically, but also express a shape having, for example, unevenness or chamfering portions within a range that provides the same effect, unless otherwise specified. Expressions that an X "is provided with", "is equipped with", "is furnished with", "includes", or "has" a component are not exclusive expressions that exclude the existence of other components. Expression "at least one of A, B and C" includes a meaning of only A, only B, only C, a meaning of any two of A, B and C, and a meaning of all of A, B and C.

First Embodiment

<Schematic Configuration of Substrate Processing System>

FIG. 1 is a diagram schematically illustrating an example of a configuration of a substrate processing system 100. The substrate processing system 100 is a single-wafer processing system that processes substantially circular substrates W such as semiconductor wafers one by one with a treatment solution such as a chemical solution or a rinsing solution. The substrate processing system 100 includes an indexer block 110, a processing block 120 coupled to the indexer block 110, and a control unit 130 that controls the operation of the device and the opening and closing of valves provided in the substrate processing system 100.

The indexer block 110 includes a carrier holding unit 111, an indexer robot IR, and an IR movement mechanism 112. The carrier holding unit 111 holds carriers C that accommodate a plurality of substrates W. The plurality of carriers C are held by the carrier holding unit 111 in a state of being arranged in the horizontal carrier arrangement direction D. The IR movement mechanism 112 moves the indexer robot IR in the carrier arrangement direction D. The indexer robot IR performs a conveying-in operation of conveying the substrate W into the carrier C held by the carrier holding unit 111 and a conveying-out operation of conveying the substrate W out from the carrier C. The substrate W is conveyed in a horizontal posture by the indexer robot IR. The horizontal posture here indicates a state in which the thickness direction of the substrate W is along the vertical direction.

Meanwhile, the processing block 120 includes a plurality of (for example, four or more) processing units 121 for processing the substrates W, and a center robot CR. The plurality of processing units 121 are arranged so as to surround the center robot CR in plan view. The plurality of processing units 121 include, for example, a chemical solution supply unit 121a for supplying a chemical solution to the substrate W, a reaction unit 121b for advancing the reaction between the substrate W and the chemical solution, and a rinsing unit 121c for washing away the chemical solution supplied to the substrate W. The center robot CR performs a conveying-in operation of conveying the substrate W into the processing unit 121 and a conveying-out operation of conveying the substrate W out from the processing unit 121. Further, the center robot CR transfers the substrate W between the plurality of processing units 121. The substrate W is transfers in the horizontal posture by the center robot CR. The center robot CR receives the substrate W from the indexer robot IR and passes the substrate W to the indexer robot IR.

<Configuration of Substrate Processing Apparatus 1>

Figure 2:
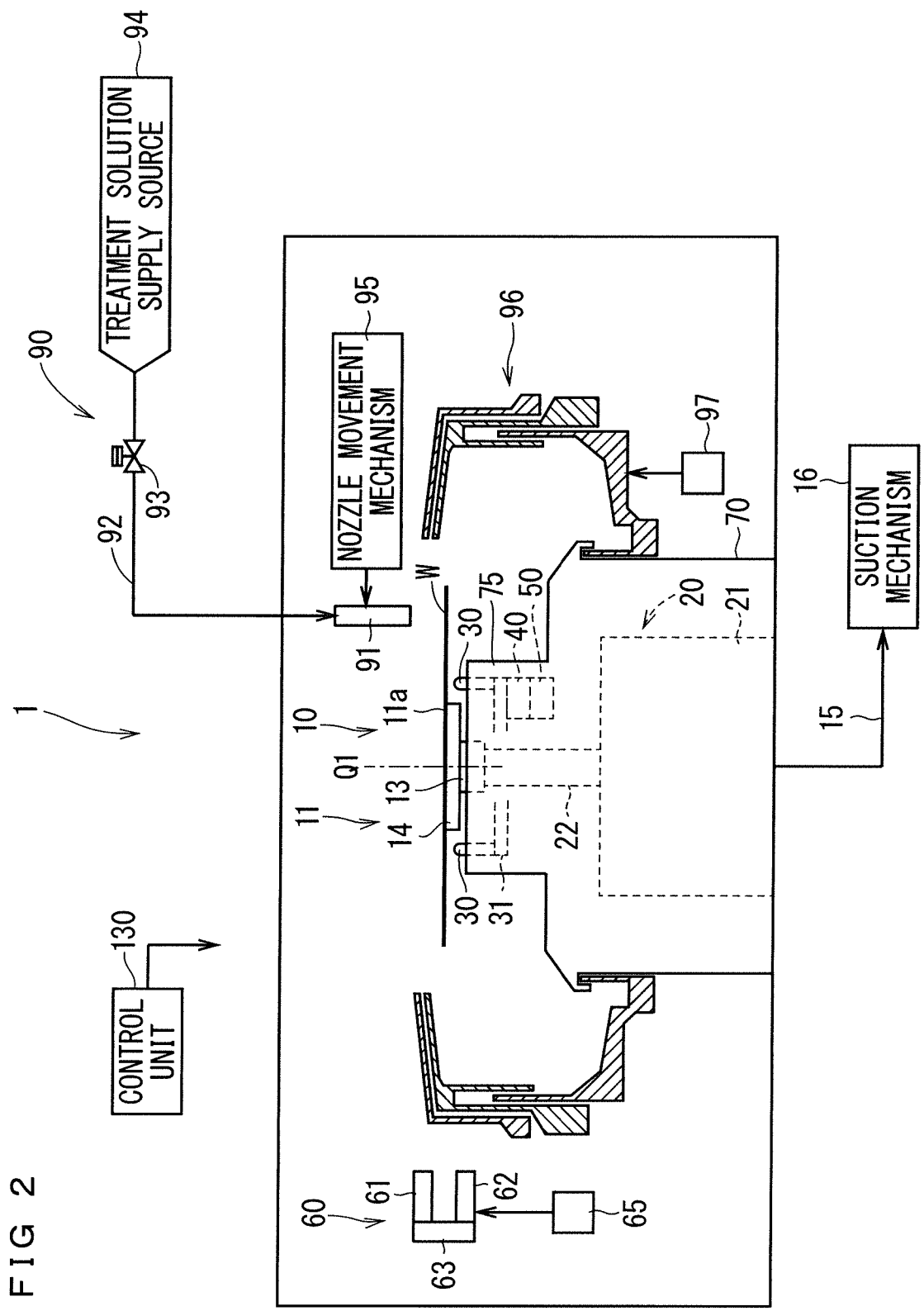
FIG. 2 A diagram schematically illustrating an example of a configuration of a substrate processing apparatus.
Figure 3:
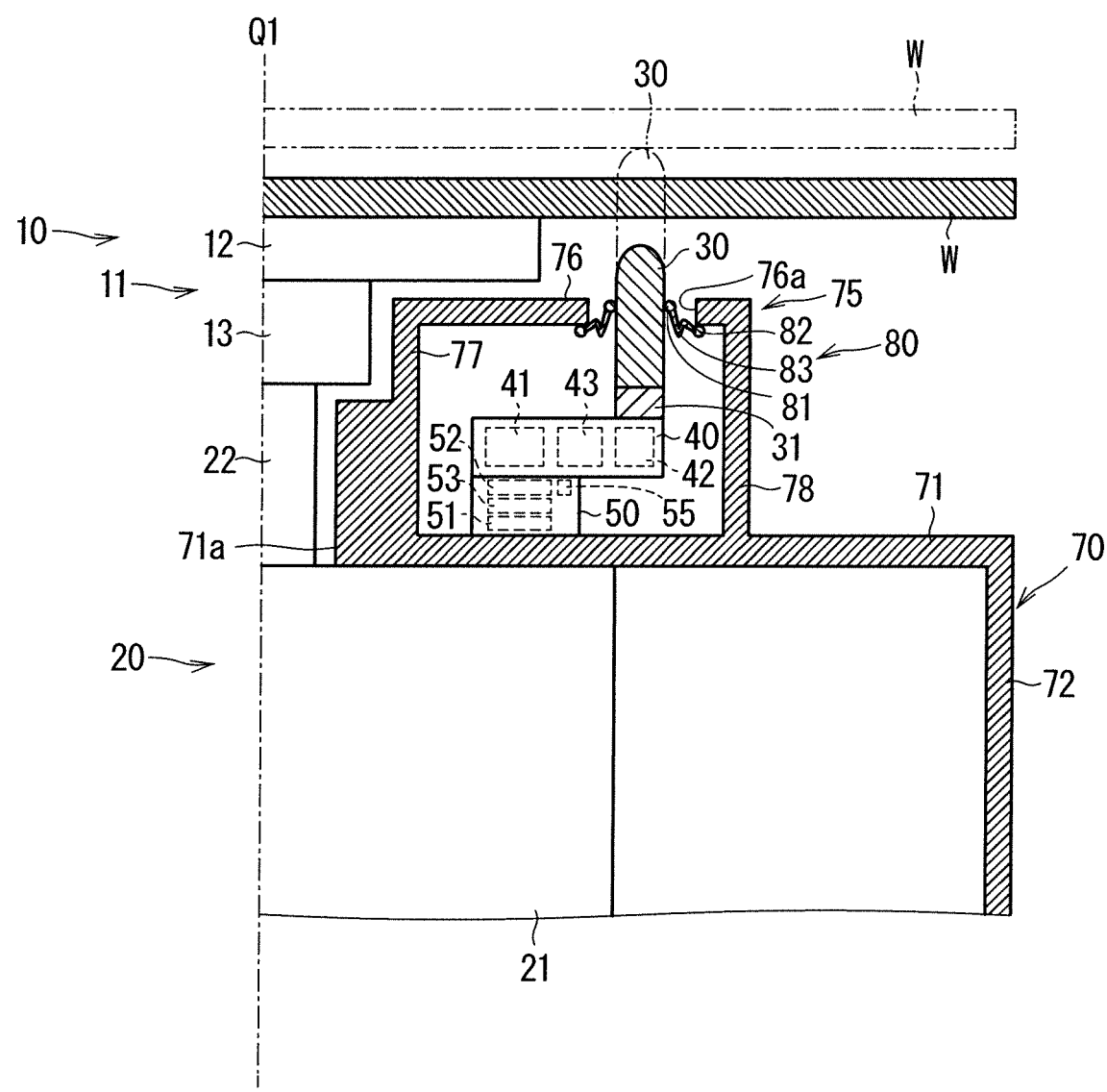
FIG. 3 An enlarged view illustrating the example of a part of the configuration of the substrate processing apparatus.

FIG. 2 is a diagram schematically illustrating an example of a configuration of a substrate processing apparatus 1 being an example of the processing unit 121, and FIG. 3 is an enlarged view illustrating the example of a part of the configuration of the substrate processing apparatus 1. The substrate processing apparatus 1 includes a suction holding mechanism 10, a rotation mechanism 20, lift pins 30, a vertical movement mechanism 40, a horizontal movement mechanism 50, a sensor 60, and a processing unit 90.

The suction holding mechanism 10 sucks the back surface of the substrate W and holds the substrate W horizontally. The "back surface" referred to here is, for example, a surface with no device is formed of the main surfaces of the substrate W. The substrate W is held by the suction holding mechanism 10 in a posture in which the back surface faces downward. In the example of FIG. 2, the suction holding mechanism 10 includes a suction member 11, and the substrate W is placed on a suction surface 11a of the suction member 11. In the example of FIG. 2, the suction member 11 includes a plate-shaped member 12 having the suction surface 11a on the upper surface thereof, and a cylindrical member 13 extending downward from the central portion of the lower surface of the plate-shaped member 12. The suction surface 11a of the suction member 11 has, for example, a circular shape in plan view. The diameter of the suction surface 11a of the suction member 11 is smaller than the diameter of the substrate W, and is, for example, one-fourth or less of the diameter of the substrate W.

A suction port (not illustrated) is formed on the suction surface 11a of the suction member 11. A plurality of suction ports may be formed on the suction surface 11a in a dispersed manner. Inside the suction member 11, an internal flow path (not illustrated) connected to the suction port is formed. The internal flow path is connected to a suction mechanism 16 via a suction pipe 15. The suction mechanism 16 includes, for example, a pump, and sucks gas from the inside of the suction pipe 15. Consequently, the gas is sucked from the suction port of the suction surface 11a, and the substrate W is sucked and held by the suction member 11. The suction mechanism 16 is controlled by the control unit 130.

The rotation mechanism 20 rotates the suction holding mechanism 10 (more specifically, the suction member 11) about a rotation axis Q1. As a result, the substrate W sucked and held by the suction holding mechanism 10 also rotates about the rotation axis Q1. The rotation axis Q1 is a virtual axis extending along the vertical direction.

The rotation mechanism 20 includes a motor 21. The motor 21 is coupled to the suction member 11 via a shaft 22. The shaft 22 extends along the rotation axis Q1 and the upper end thereof is coupled to the suction member 11. Specifically, the upper end of the shaft 22 is coupled to the cylindrical member 13 of the suction member 11. The shaft 22 is, for example, a hollow shaft having a cylindrical shape, and the suction pipe 15 is connected to the internal flow path of the suction member 11 through the hollow portion of the shaft 22.

The motor 21 is coupled to the shaft 22 and rotates the shaft 22 about the rotation axis Q1. In the example of FIG. 2, the motor 21 is provided coaxially with the shaft 22. The shaft 22 extends upward from the motor 21. By rotating the shaft 22 by the motor 21, the suction member 11 rotates about the rotation axis Q1. The motor 21 is controlled by the control unit 130.

The motor 21 is stored in a motor storing member 70. The motor storing member 70 has at least an upper surface portion 71 and a side surface portion 72 (see also FIG. 3). The upper surface portion 71 is located above the motor 21. The upper surface portion 71 has a substantially plate-like shape, for example, a disk-like shape with the rotation axis Q1 as the center thereof. A through hole 71a penetrated by the shaft 22 is formed in the central portion of the upper surface portion 71. A seal bearing (not illustrated) may be provided in the through hole 71a of the upper surface portion 71. Specifically, the inner ring of the seal bearing is attached to the outer peripheral surface of the shaft 22, and the outer ring is attached to the upper surface portion 71. As a result, the shaft 22 is rotatably coupled to the motor storing member 70.

The side surface portion 72 has a cylindrical shape and extends downward from the outer peripheral edge of the upper surface portion 71. The side surface portion 72 surrounds the side surfaces of the motor 21. The lower end peripheral edge of the side surface portion 72 may be located at the same height as, or below the lower end of the motor 21, for example. The lower end peripheral edge of the side surface portion 72 is coupled to, for example, the floor surface of the substrate processing apparatus 1. The floor surface of the substrate processing apparatus 1 is, for example, the upper surface of a support base provided with a plurality of processing units 121 (substrate processing apparatus 1). The motor storing member 70 may be directly coupled to the floor surface of the substrate processing device 1, or may be coupled to the floor surface via another fixed body (for example, a plate-shaped base).

The motor storing member 70 is fixed in the substrate processing apparatus 1 and is a non-driving body that does not substantially displace. That is, no drive body is provided between the motor storing member 70 and the floor surface of the substrate processing apparatus 1.

The motor storing member 70 protects the motor 21 from an external processing atmosphere. As a specific example, the motor 21 is protected from the chemical solution discharged from a nozzle 91 and the rinsing solution discharged from a rinsing nozzle (not illustrated) which will be described later.

The processing unit 90 processes the substrate W that is sucked and held by the suction holding mechanism 10. Here, the processing unit 90 performs bevel treatment that supplies the treatment solution to the peripheral edge portion of the substrate W. In the example of FIG. 2, the processing unit 90 includes the nozzle 91, a pipe 92, and a valve 93. The nozzle 91 discharges the treatment solution toward the peripheral edge portion of the substrate W held by the suction holding mechanism 10. In the example of FIG. 2, the nozzle 91 is located above the peripheral edge portion of the substrate W.

The peripheral edge portion of the substrate W corresponds to an annular region having a predetermined width from the peripheral edge of the substrate W. The diameter of the substrate W is, for example, several hundred mm, and the predetermined width is, for example, about several mm or less. The treatment solution contains, for example, a chemical solution such as an etching solution capable of removing impurities (metals and the like) adhering to the peripheral edge portion of the substrate W.

The nozzle 91 is connected to a treatment solution supply source 94 via the pipe 92. The treatment solution supply source 94 supplies the chemical solution to the nozzle 91 via the pipe 92. The nozzle 91 discharges the chemical solution to the peripheral edge portion of the surface of the substrate W. The valve 93 is inserted in the middle of the pipe 92. The valve 93 switches the opening and closing of the internal flow path of the pipe 92. The valve 93 is controlled by the control unit 130. The valve 93 may be a valve that adjusts the flow rate of the chemical solution flowing inside the pipe 92.

The nozzle 91 supplies the chemical solution to the peripheral edge portion of the substrate W in rotation with the valve 93 opening in a state where the rotating mechanism 20 is rotating the suction holding mechanism 10 and the substrate W. As a result, the chemical solution is supplied over the entire circumference of the peripheral edge portion of the substrate W, removing impurities in the peripheral edge portion of the substrate W (so-called bevel treatment). The chemical solution is subject to the centrifugal force accompanying the rotation of the substrate W and scatters outward from the peripheral edge of the substrate W.

In the example of FIG. 2, the nozzle 91 is movable between the processing position and the standby position by a nozzle movement mechanism 95. The nozzle movement mechanism 95 includes, for example, a motor and is controlled by the control unit 130. The processing position is a position where the nozzle 91 discharges the chemical solution, and in the example of FIG. 2, is located above the substrate W, and faces the peripheral edge portion of the substrate W. The standby position is a position where the nozzle 91 does not discharge the chemical solution, for example, a position where the nozzle 91 does not face the substrate W in the vertical direction. That is, for example, the standby position is a position outside the peripheral edge of the substrate W in plan view.

The processing unit 90 may discharge a plurality of types of processing solutions to the peripheral edge portion of the substrate W. For example, the processing unit 90 may include a plurality of nozzles according to the types of processing solutions. For example, a chemical solution and a rinsing solution are adoptable as the treatment solution. In addition, two types of chemical solutions (for example, an alkaline chemical solution and an acidic chemical solution) are adoptable as the chemical solutions. As the rinsing solution, for example, pure water is adoptable. These nozzles may be arranged side by side along the circumferential direction of the substrate W and may be integrally coupled to each other. A structure in which a plurality of nozzles are coupled in this manner is also referred to as a nozzle head.

Hereinafter, a mode in which a rinsing nozzle is provided in addition to the nozzle 91 will be described. Specifically, the processing unit 90 further includes, for example, a rinsing nozzle, a rinsing pipe, and a rinsing valve (not illustrated). The rinsing nozzle discharges the rinsing solution toward the peripheral edge portion of the substrate W held by the suction holding mechanism 10. The rinsing solution is a treatment solution for washing away the chemical solution on the peripheral edge portion of the substrate W.

The rinsing nozzle is connected to a rinsing solution supply source via the rinsing pipe. The rinsing valve is inserted in the rinsing pipe to switch the opening and closing of the internal flow path of the rinsing pipe. The rinsing valve 93 is controlled by the control unit 130. The rinsing valve may be a valve that adjusts the flow rate of the rinsing solution flowing inside the rinsing pipe.

The processing unit 90 washes away the chemical solution on the peripheral edge portion of the substrate W by supplying the rinsing solution after supplying the chemical solution to the peripheral edge portion of the substrate W. In other words, the chemical solution on the peripheral edge portion of the substrate W is replaced with the rinsing solution. The rinsing solution is subject to the centrifugal force accompanying the rotation of the substrate W and scatters outward from the peripheral edge of the substrate W. The rinsing nozzle is coupled to, for example, the nozzle 91, and is movable between the processing position and the standby position by the nozzle movement mechanism 95.

In the example of FIG. 2, the substrate processing apparatus 1 further includes a guard 96. The guard 96 has a cylindrical shape surrounding the substrate W in plan view. The guard 96 receives the treatment solution scattered from the peripheral edge of the substrate W and makes the treatment solution flow to a recovery unit (not illustrated). The guard 96 is movable in the vertical direction by a guard movement mechanism 97. The guard movement mechanism 97 moves the guard 96 between an upper position where the upper end of the guard 96 is located above the substrate W and a lower position where the upper end of the guard 96 is located below the substrate W. The guard movement mechanism 97 includes, for example, a cylinder mechanism or a ball screw mechanism.

Meanwhile, in the above-mentioned bevel treatment, impurities in the peripheral edge portion of the substrate W are removed by the chemical solution. On the other hand, the region inside the peripheral edge portion of the surface of the substrate W corresponds to the device region on which the device is formed; therefore, it is desired that the chemical solution does not enter the device region. Therefore, the position of the substrate W covered with the chemical solution matters. For example, when the center of the substrate W is deviated from the rotation axis Q1, that is, when the substrate W is eccentric, the position of the substrate W covered with the chemical solution varies in the radial direction with the rotation of the substrate W. When this variation becomes larger, the chemical solution consequently enters the device region, so it is desirable that the deviation (eccentricity) between the center of the substrate W and the rotation axis Q1 is small.

In the embodiment, the substrate processing apparatus 1 includes a position adjustment mechanism for cancelling the eccentric state by adjusting the position of the substrate W in the horizontal plane. Specifically, the substrate processing apparatus 1 includes, as the position adjusting mechanism, a plurality of lift pins 30, a vertical movement mechanism 40, and a horizontal movement mechanism 50.

The plurality of lift pins 30 are provided at positions opposite to the back surface of the substrate W held by the suction holding mechanism 10. That is, the plurality of lift pins 30 are provided below the substrate W and on the rotation axis Q1 side rather than the peripheral edge of the substrate W. Each lift pin 30 has an elongated shape extending in the vertical direction. Specifically, the lift pin 30 has a rod-like shape whose length in the vertical direction is longer than that in the horizontal direction. Here, the vertical direction is parallel to the gravity direction. The tip portion of the lift pin 30 may have a tapered shape that becomes narrower toward upward. In the example of FIG. 2, the upper end of the lift pin 30 has a shape along a hemisphere.

Figure 4:
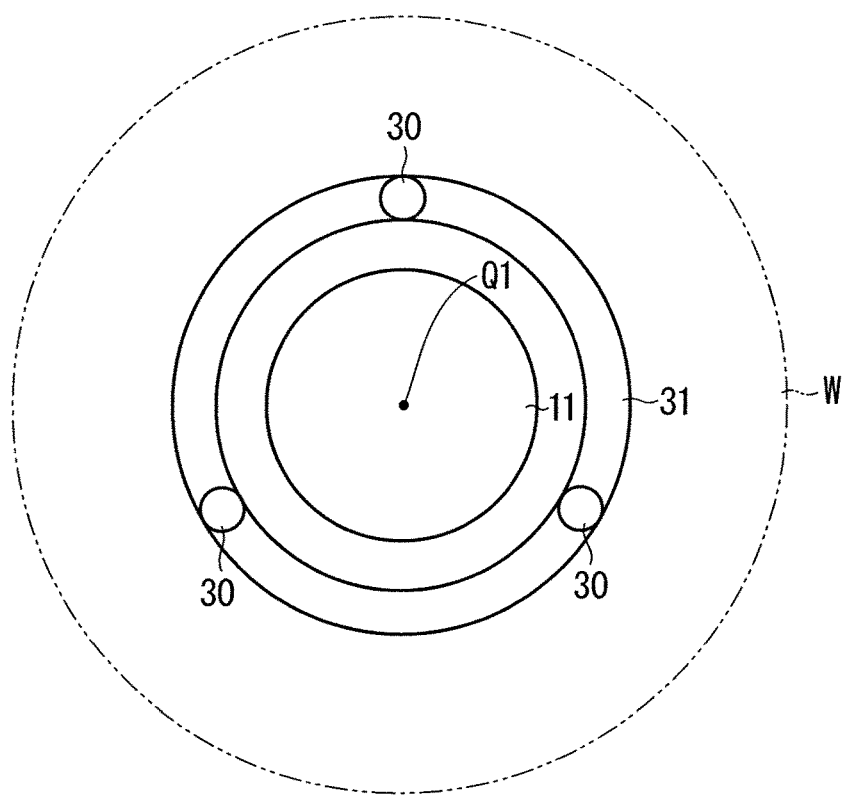
FIG. 4 A plan view schematically illustrating an example of a configuration of a suction holding mechanism and lift pins.

The plurality of lift pins 30 are arranged around the rotation axis Q1, and more specifically, arranged at equal intervals on a virtual circle centered on the rotation axis Q1. FIG. 4A plan view schematically illustrating an example of a configuration of a suction holding mechanism 10 and lift pins 30. In the example of FIG. 4, three lift pins 30 are arranged at 120 degree intervals. The number of lift pins 30 can be changed as appropriate.

The plurality of lift pins 30 are provided so as to be movable in the vertical direction. The vertical movement mechanism 40 reciprocates the plurality of lift pins 30 between the upper position and the lower position. The lower position is a position where the upper ends of the lift pins 30 is at below the suction surface 11a of the suction holding mechanism 10. In FIGS. 2 and 3, the lift pins 30 are located at the lower position. The upper position is a position where the upper ends of the lift pins 30 are at above the suction surface 11a of the suction holding mechanism 10. The plurality of lift pins 30 support the substrate W in a state of being located at the upper position. In the example of FIG. 3, the lift pins 30 located at the upper position and the substrate W are illustrated by virtual lines. The configuration of the vertical movement mechanism 40 is not particularly limited, however, the vertical movement mechanism 40 includes a linear motor mechanism, a ball screw mechanism, or a cylinder mechanism, and is controlled by the control unit 130, for example.

The plurality of lift pins 30 may be coupled to each other by, for example, a coupling member 31. The coupling member 31 has an annular plate shape surrounding the rotation axis Q1. In the example of FIGS. 3 and 4, the lift pins 30 project upward from the upper surface of the coupling member 31. The vertical movement mechanism 40 moves the coupling member 31 in the vertical direction. Accordingly, the plurality of lift pins 30 coupled to the coupling member 31 move integrally in the vertical direction.

The vertical movement mechanism 40 includes a fixed body 41, a movable body 42, and a drive mechanism 43. In the example of FIG. 3, the fixed body 41, the movable body 42, and the drive mechanism 43 are schematically illustrated by blocks. The shape, size, and positional relationship of each block illustrated in FIG. 3 do not indicate the shape, size, and positional relationship of the configurations of the fixed body 41, the movable body 42, and the drive mechanism 43. This applies to the horizontal movement mechanism 50 described later as well.

The movable body 42 is provided so as to be movable along the vertical direction with respect to the fixed body 41. The drive mechanism 43 exerts a driving force on the movable body 42 to move the movable body 42 in the vertical direction with respect to the fixed body 41. The drive mechanism 43 includes, for example, a motor. For example, the movable body 42 is appropriately coupled to the rotor of the motor via a link member or the like, and the movable body 42 moves in the vertical direction with respect to the fixed body 41 when the link member is displaced by the motor. The movable body 42 is coupled to the coupling member 31. By moving the movable body 42 in the vertical direction with respect to the fixed body 41 by the drive mechanism 43, the coupling member 31 coupled to the movable body 42 and the plurality of lift pins 30 coupled to the coupling member 31 integrally moves in the vertical direction.

With the substrate W placed on the suction surface 11a of the suction holding mechanism 10, the plurality of lift pins 30 move integrally from the lower position to the upper position to lift the substrate W from the suction holding mechanism 10. At this point, the upper ends of the plurality of lift pins 30 come into contact with the back surface of the substrate W, and the plurality of lift pins 30 horizontally support the substrate W. The lift pin 30 may come into contact with the lower surface of the substrate W in point contact. According to the configuration, the contamination of the lower surface of the substrate W by the lift pins 30 is reduced.

The horizontal movement mechanism 50 horizontally moves the plurality of lift pins 30. The horizontal movement mechanism 50 integrally moves the plurality of lift pins 30 in, for example, one horizontal direction. Hereinafter, this one direction is referred to as a horizontal movement direction. The horizontal movement direction is a direction along the radial direction of the rotation axis Q1. The horizontal movement mechanism 50 is not particularly limited, however, the horizontal movement mechanism 50 includes a linear motor mechanism, a ball screw mechanism, or a cylinder mechanism, and is controlled by the control unit 130, for example.

The horizontal movement mechanism 50 includes a fixed body 51, a movable body 52, and a drive mechanism 53. The movable body 52 is provided so as to be movable along the horizontal direction with respect to the fixed body 51. The drive mechanism 53 exerts a driving force on the movable body 52 to move the movable body 52 with respect to the fixed body 51. For example, when the horizontal movement mechanism 50 has a linear motor mechanism, the drive mechanism 53 is a linear motor. The linear motor includes a stator and a mover, and moves the mover in the horizontal movement direction with respect to the stator. For example, a linear motor includes a coil attached to the stator and a permanent magnet attached to the mover, and their magnetism causes the mover to move in the horizontal direction with respect to the stator. The fixed body 51 is coupled to the stator of the linear motor, and the movable body 52 is coupled to the mover of the linear motor.

The movable body 52 of the horizontal movement mechanism 50 is coupled to the fixed body 41 of the vertical movement mechanism 40. Therefore, when the movable body 52 moves in the horizontal movement direction, the vertical movement mechanism 40, the coupling member 31, and the plurality of lift pins 30 move integrally in the horizontal movement direction.

The substrate processing apparatus 1 may also be provided with a position measurement sensor 55 that detects the position of the movable body 52 of the horizontal movement mechanism 50 in the horizontal movement direction. The position measurement sensor 55 is also referred to as a linear encoder. For example, the position measuring sensor 55 includes a scale extending in the horizontal movement direction and a scanning member provided so as to be movable in the horizontal movement direction with respect to the scale. The scanning member is coupled to the movable body 52 and moves integrally with the movable body 52. For example, the scanning member incorporates a light source that irradiates the scale with light and a light receiving element that receives light transmitted or reflected by the scale, and the position of the scanning member with respect to the scale, that is, the position of the movable body 52 in the horizontal movement direction is detected by irradiating the scale with the light. The position measurement sensor 55 outputs an electric signal indicating the position of the movable body 52 to the control unit 130. The position measurement sensor 55 may be built in the horizontal movement mechanism 50. The control unit 130 controls the horizontal movement mechanism 50 based on the position of the movable body 52 measured by the position measurement sensor 55.

The vertical movement mechanism 40 moves the plurality of lift pins 30 from the lower position to the upper position, so that the plurality of lift pins 30 can lift and support the substrate W from the suction holding mechanism 10. In this state, the horizontal movement mechanism 50 moves the plurality of lift pins 30 in the horizontal movement direction, so that the position of the substrate W in the horizontal movement direction can be adjusted. After adjusting the position of the substrate W by the horizontal movement mechanism 50, the vertical movement mechanism 40 moves the plurality of lift pins 30 from the upper position to the lower position. As a result, the substrate W is placed on the suction surface 11a of the suction holding mechanism 10. As described above, the placement of the substrate W is redone on the suction surface 11a of the suction holding mechanism 10 by adjusting the position of the substrate W in the horizontal movement direction.

In the example of the embodiment, the rotation of the substrate W by the rotation mechanism 20 is also utilized for adjusting the horizontal position of the substrate W. This point will be described in detail later.

In the example of FIG. 3, the vertical movement mechanism 40 and the horizontal movement mechanism 50 are coupled to the motor storing member 70. As a more specific example, the vertical movement mechanism 40 and the horizontal movement mechanism 50 are provided on the upper surface of the upper surface portion 71 of the motor storing member 70. In the example of FIG. 3, the fixed body 51 of the horizontal movement mechanism 50 is coupled to the upper surface portion 71 of the motor storing member 70. Being coupled to the motor storing member 70 (that is, a non-driving body) fixed to the floor surface of the substrate processing apparatus 1, the fixed body 51 is not driven. That is, in the example of FIG. 2, the fixed body 51 is also a non-driving body.

In the above example, although the vertical movement mechanism 40 moves in the horizontal movement direction by the horizontal movement mechanism 50, the configuration is not limited thereto. For example, the positional relationship between the vertical movement mechanism 40 and the horizontal movement mechanism 50 may be reversed. That is, the vertical movement mechanism 40 may integrally move the horizontal movement mechanism 50 and the plurality of lift pins 30 along the vertical direction. In other words, the fixed body 41 of the vertical movement mechanism 40 may be coupled to the motor storing member 70, the movable body 42 may be coupled to the fixed body 51 of the horizontal movement mechanism 50, and the movable body 52 may be coupled to the coupling member 31.

As illustrated in FIG. 3, the substrate processing apparatus 1 may be provided with a movement mechanism storing member 75 for storing the vertical moving mechanism 40 and the horizontal moving mechanism 50. In the example of FIG. 3, the movement mechanism storing member 75 includes an upper surface portion 76, an inner peripheral wall 77, and an outer peripheral wall 78. The inner peripheral wall 77 has a cylindrical shape surrounding the outer peripheral surface of the shaft 22. The inner peripheral wall 77 faces the shaft 22 at a distance. The lower end peripheral edge of the inner peripheral wall 77 is coupled to the upper surface portion 71 of the motor storing member 70.

The outer peripheral wall 78 has a cylindrical shape surrounding the outer peripheral surface of the inner peripheral wall 77 at a distance. The lower end peripheral edge of the outer peripheral wall 78 is coupled to the upper surface portion 71 of the motor storing member 70. The vertical movement mechanism 40 and the horizontal movement mechanism 50 are provided between the inner peripheral wall 77 and the outer peripheral wall 78.

The upper surface portion 76 is located above both the vertical movement mechanism 40 and the horizontal movement mechanism 50, and is coupled to the upper end peripheral edge of the outer peripheral wall 78 and the upper end peripheral edge of the inner peripheral wall 77. A through hole 76a penetrated by each lift pin 30 is formed on the upper surface portion 76. The number of through holes 76a is equal to the number of lift pins 30. In the above example, the three lift pins 30 are provided; therefore, the upper surface portion 76 is formed with the three through holes 76a. In plan view, the through hole 76a is wider than the lift pin 30, and the lift pin 30 is movable in the horizontal movement direction while penetrating the through hole 76a.

When the lift pin 30 moves in the horizontal movement direction and comes into contact with the peripheral edge portion of the upper surface portion 76 around the through hole 76a, the lift pin 30 cannot move any further. That is, the movable distance of the lift pin 30 is defined by the size of the lift pin 30 and the size of the through hole 76a in plan view. This movable distance need only be set to a value sufficient to cancel the eccentric state of the substrate W, and is, for example, several mm or less.

A seal 80 for sealing the through hole 76a is provided between the upper surface portion 76 of the movement mechanism storing member 75 and each lift pin 30. The seal 80 seals between the upper surface portion 76 and the lift pin 30 so that the lift pin 30 can move in vertical direction and horizontal movement direction. The seal 80 is made of a material that is elastically deformable (for example, a resin such as rubber), and includes a close contact portion 81, a close contact portion 82, and a deformable portion 83. The close contact portion 81 has an annular shape, and is in close contact with the entire circumference in a part of the lift pin 30 in the longitudinal direction. The close contact portion 82 has an annular shape larger than that of the close contact portion 81, and is in close contact with the peripheral edge portion forming the through hole 76a of the upper surface portion 76. In the example of FIG. 4, the close contact portion 82 is in close contact with the lower surface of the upper surface portion 76, and is fixed to the upper surface portion 76 by, for example, a predetermined fixing member (not illustrated).

The deformable portion 83 is coupled to the close contact portion 81 and the close contact portion 82. The close contact portion 81, the close contact portion 82, and the deformable portion 83 may be integrally made of the same material. The deformable portion 83 is a thin film portion thinner than the close contact portion 81 and the close contact portion 82, and has a substantially bellows-like shape. As a specific example, the deformable portion 83 has a first umbrella portion that extends downward as it moves away from the peripheral edge of the close contact portion 81, and a first reverse umbrella portion that extends upward as it moves away from the outer peripheral edge of the first umbrella portion, and a second umbrella portion that extends downward as it moves away from the outer peripheral edge of the first reverse umbrella portion and is coupled to the close contact portion 82. A coupling angle of the first umbrella portion and the first reverse umbrella portion, and a coupling angle of the first reverse umbrella portion and the second umbrella portion are variable due to the elastic deformation of the deformable portion 83, respectively. Such a seal 80 may also be referred to as a boot.

The deformable portion 83 elastically deforms as the lift pin 30 moves in the vertical direction and the horizontal movement direction. Specifically, the deformable portion 83 is elastically deformed so that the coupling angle changes appropriately. Due to the elastic deformation of the deformed portion 83, the close contact portion 81 continues to be in close contact with the lift pin 30, and the close contact portion 82 continues to be in close contact with the upper surface portion 76 even if the lift pin 30 moves in the vertical direction and the horizontal moving direction. That is, the seal 80 seals the through hole 76a.

The movement mechanism storing member 75 and the seal 80 protect the vertical movement mechanism 40 and the horizontal movement mechanism 50 from the external processing atmosphere. As a specific example, the vertical movement mechanism 40 and the horizontal movement mechanism 50 are protected from the chemical solution discharged from the nozzle 91 and the rinsing solution discharged from the rinsing nozzle.

In the example of FIG. 2, the substrate processing apparatus 1 is provided with a sensor 60 for detecting the eccentric state of the substrate W. The eccentric state referred to, here, indicates a deviation amount (hereinafter, also referred to as an eccentric amount) between the center of the substrate W and the rotation axis Q1 and a deviation direction (hereinafter, also referred to as an eccentric direction).

In the example of FIG. 2, the substrate processing apparatus 1 includes a sensor movement mechanism 65. The sensor movement mechanism 65 reciprocates the sensor 60 between a measurement position and a standby position, which will be described later. The sensor movement mechanism 65 includes, for example, a linear motor mechanism, a ball screw mechanism or a cylinder mechanism, and is controlled by the control unit 130.

The standby position of the sensor 60 is a position where the sensor 60 does not measure the eccentric state of the substrate W, for example, a position where the sensor 60 does not face the substrate W in the vertical direction. In the example of FIG. 2, the sensor 60 is located in the standby position.

Figure 5:
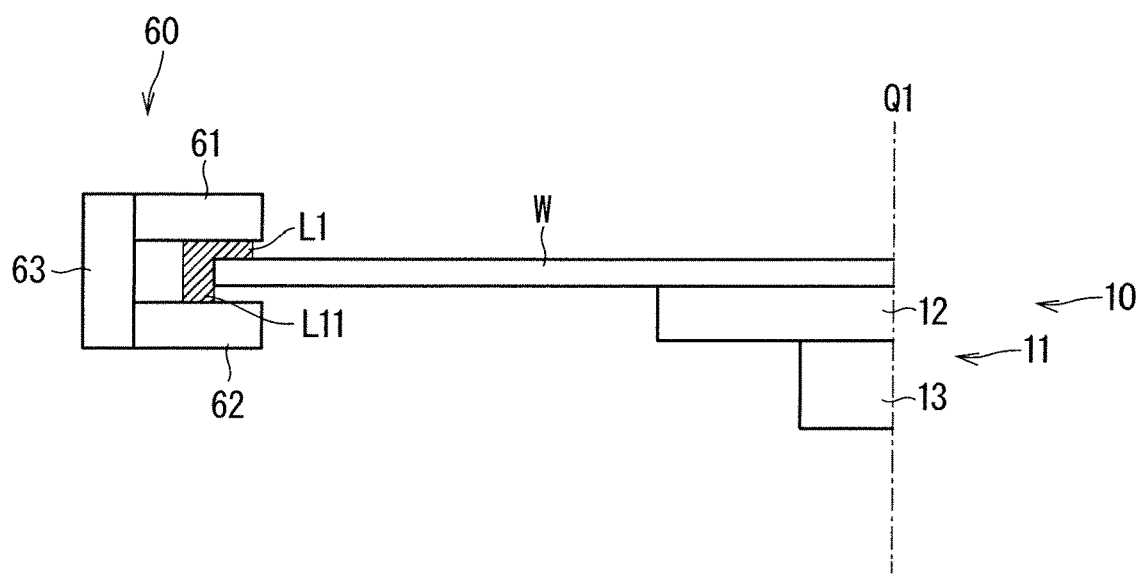
FIG. 5 A diagram schematically illustrating an example of a configuration of a sensor and a substrate.

The measurement position of the sensor 60 is a position when the sensor 60 measures the eccentric state of the substrate W. FIG. 5 is a diagram schematically illustrating an example of a configuration of the sensor 60 and the substrate W. In FIG. 5, the sensor 60 is stopped at the measurement position. In the example of FIG. 5, the sensor 60 includes a light emitting unit 61 and a light receiving unit 62. The light emitting unit 61 is located above the substrate W which is sucked and held by the suction holding mechanism 10. With the sensor 60 stopped at the measurement position, the light emitting unit 61 faces the peripheral edge portion of the substrate W in the vertical direction. The light emitting unit 61 irradiates the light L1 toward the peripheral edge portion of the substrate W. The light emitting unit 61 includes a light source such as an LED. Although the wavelength of the light L1 is not particularly limited, infrared rays is adoptable as the light L1, for example. The light L1 is wide radially at least with respect to the axis of rotation Q1. An inside part of the light L1 in the radial direction is blocked by the peripheral edge portion of the substrate W, and the remaining part of the light L1 (hereinafter referred to as the light L11) travels on the outside of the substrate W in the vertical direction.

In the example of FIG. 5, the light receiving unit 62 is located on the side opposite to the light emitting unit 61 with respect to the peripheral edge portion of the substrate W which is sucked and held by the suction holding mechanism 10. That is, the peripheral edge portion of the substrate W is located between the light emitting portion 61 and the light receiving portion 62. The light receiving unit 62 receives the light L11 traveling on the radial outside of the substrate W of the light L1 from the light emitting unit 61. The light receiving unit 62 includes a light receiving element (also referred to as a photoelectric transducer) such as a phototransistor and a photodiode. The light receiving unit 62 outputs an electric signal indicating the amount of light (for example, intensity) of the received light L11 to the control unit 130.

When the center of the substrate W coincides with the rotation axis Q1, the amount of received light by the light receiving unit 62 during one rotation of the substrate W is ideally always constant. Meanwhile, when the center of the substrate W is deviated from the rotation axis Q1, the amount of light received by the light receiving unit 62 during one rotation of the substrate W changes depending on the rotation position of the substrate W.

Figure 6:
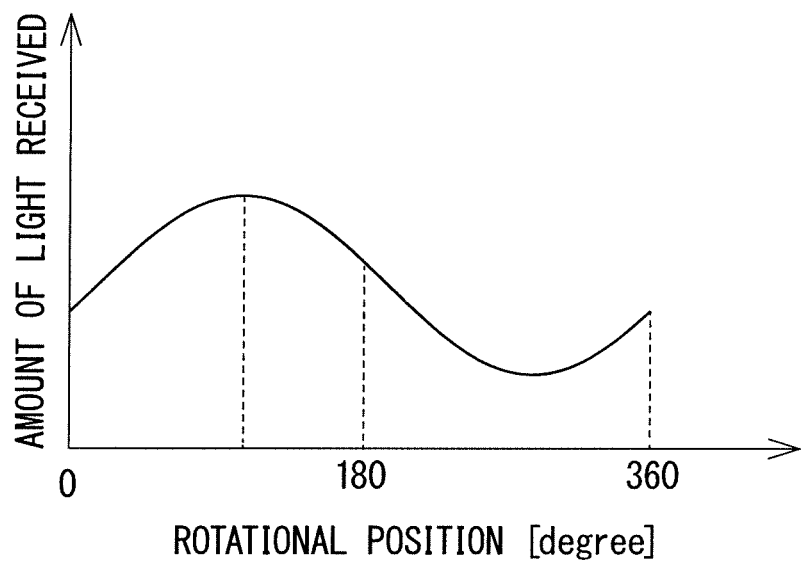
FIG. 6 A graph illustrating an example of the relationship between the amount of light received and the rotational position of the substrate.

FIG. 6 is a graph illustrating an example of the relationship between the amount of light of the light L11 and the rotational position of the substrate W. FIG. 6 illustrates a graph when the center of the substrate W is deviated from the rotation axis Q1. As illustrated in FIG. 6, the amount of received light changes in a sinusoidal manner with respect to the rotational position of the substrate W. In the waveform of the amount of received light, the amplitude of the amount of received light indicates the eccentric amount of the substrate W, and the rotation position when the amount of received light takes the maximum value or the minimum value indicates the eccentric direction. In other words, the control unit 130 obtains the eccentric state of the substrate W based on the waveform of the amount of received light acquired by the sensor 60 during one rotation of the substrate W. Specifically, the control unit 130 obtains the amplitude of the amount of received light based on the signal from the sensor 60 and obtains the eccentricity amount based on this amplitude. Further, the control unit 130 obtains the rotation angle, as the eccentric direction, at which the amount of received light takes the maximum value or the minimum value. It can be said that the eccentric state calculation function of the control unit 130 belongs to the sensor 60. That is, it can be said that the light emitting unit 61, the light receiving unit 62, and the eccentric state calculation function of the control unit 130 constitute the sensor 60. An arithmetic processing unit having the eccentricity state calculation function may also be provided separately from the control unit 130.

Further, the standby position of the sensor 60 may be included in the same horizontal plane as the measurement position. That is, the sensor movement mechanism 65 may move the sensor 60 horizontally. However, as illustrated in FIG. 2, when the guard 96 stops at the upper position, the sensor 60 and the guard 96 can collide. Therefore, the sensor movement mechanism 65 moves the sensor 60 horizontally between the standby position and the measurement position with the guard 96 retracted to the lower position. This avoids a collision between the sensor 60 and the guard 96.

Figure 7:
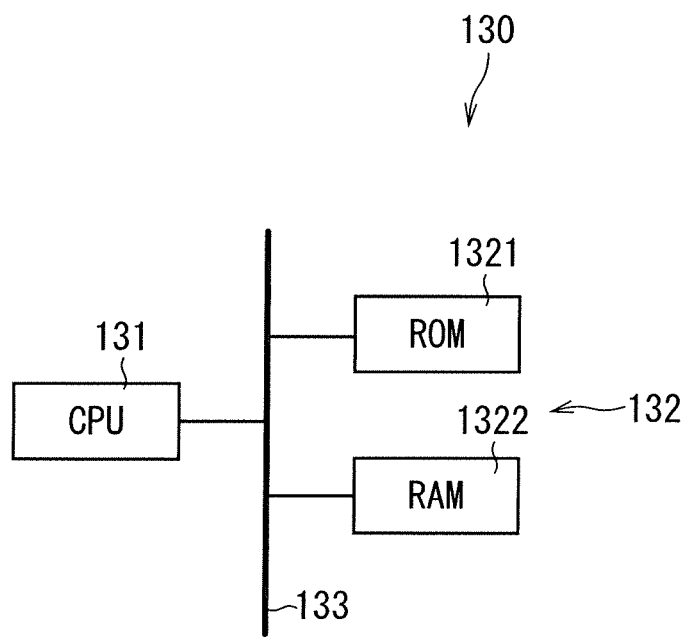
FIG. 7 A block diagram schematically illustrating an example of an internal configuration of a control unit.

The control unit 130 controls the substrate processing device 1. The control unit 130 can be said to be a control circuit. FIG. 7 is a block diagram schematically illustrating an example of an internal configuration of the control unit 130. The control unit 130 includes an arithmetic processing unit 131 and a storage medium 132. The arithmetic processing unit 131 includes a processing unit such as a Central Processing Unit (CPU). The storage medium 132 includes, for example, a non-temporary storage medium 1321 and a temporary storage medium 1322. The non-temporary storage medium 1321 includes a memory such as a Read Only Memory (ROM). The temporary storage medium 1322 includes a memory such as a Random Access Memory (RAM). In the example of FIG. 7, the arithmetic processing unit 131 and the storage medium 132 are connected to each other by a bus 133. The above various configurations electrically connected to the control unit 130 are connected to the bus 133 directly or via a communication circuit.

The non-temporary storage medium 1321 stores a program executed by the arithmetic processing unit 131. When the arithmetic processing unit 131 executes the program, the control unit 130 can execute various functions. However, some or all of the functions executed by the control unit 130 may be implemented by a hardware circuit that does not require software such as a program.

<Operation of Substrate Processing Apparatus>

Figure 8:
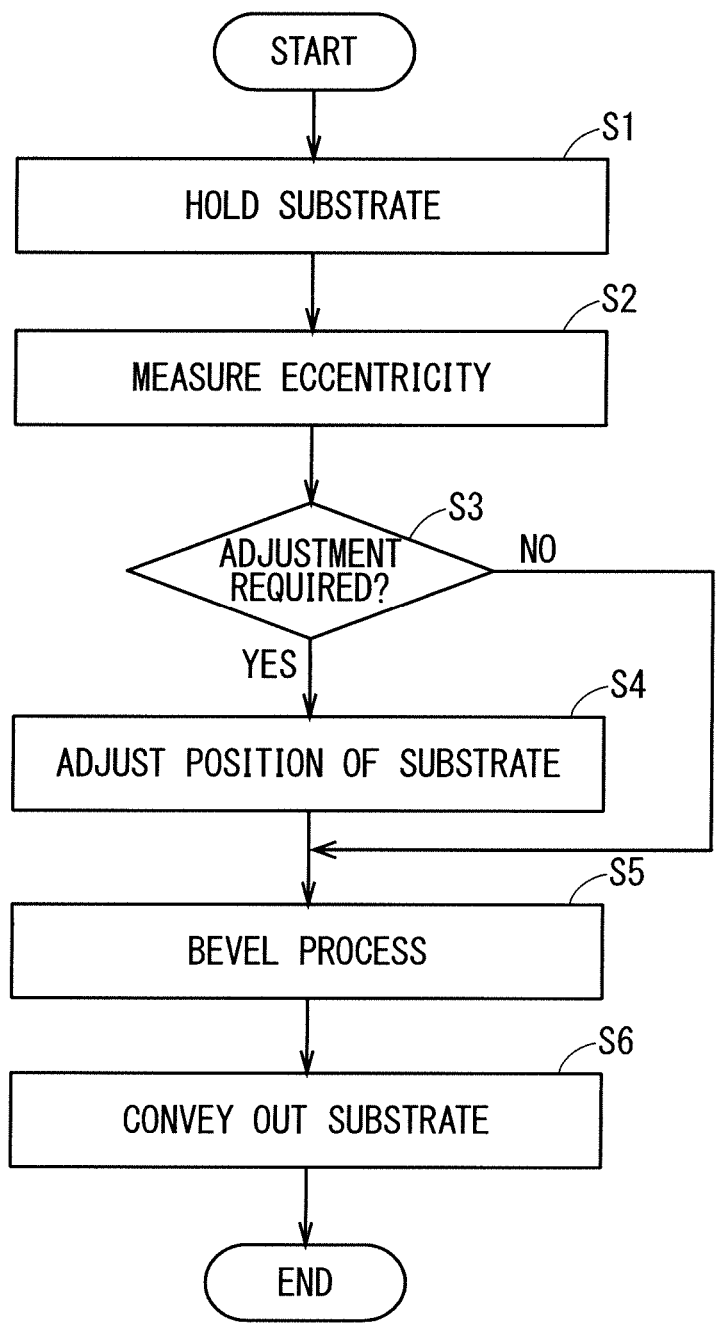
FIG. 8 A flowchart illustrating an example of the operation of the substrate processing apparatus.

Next, an example of the operation of the substrate processing apparatus 1 will be described. FIG. 8 is a flowchart illustrating an example of the operation of the substrate processing apparatus 1. Initially, the nozzle 91, the rinsing nozzle and the sensor 60 are located in their respective standby positions, and the lift pins 30 and the guard 96 are located in their respective lower positions.

First, the center robot CR passes the substrate W to the suction holding mechanism 10, and the suction holding mechanism 10 sucks and holds the substrate W (Step S1). Specifically, the suction of the gas by the suction mechanism 16 causes the suction holding mechanism 10 to suck and hold the substrate W. Next, the control unit 130 performs an eccentricity measurement process (Step S2). Specifically, first, the sensor movement mechanism 65 moves the sensor 60 horizontally to move it from the standby position to the measurement position. Next, the light emitting unit 61 irradiates the light L1, the rotation mechanism 20 rotates the substrate W, the light receiving unit 62 sequentially measures the amount of received light, and the measurement result is output to the control unit 130. The light receiving unit 62 measures, for example, the amount of received light at each predetermined rotation angle. When the waveform of the amount of received light is acquired, the rotation mechanism 20 stops the rotation of the substrate W, and the sensor movement mechanism 65 moves the sensor 60 from the measurement position to the standby position. The control unit 130 obtains the eccentric state (specifically, the eccentric amount and the eccentric direction) of the substrate W based on the waveform of the amount of received light.

Next, the control unit 130 determines whether or not the position adjustment process of the substrate W is required (Step S3). Specifically, the control unit 130 determines whether or not the eccentric amount of the substrate W is smaller than the reference value. The reference value is, for example, in the order of 100 μm or less and can be set in advance. When the eccentric amount is smaller than the reference value, the substrate W is determined to be hardly eccentric, and therefore the control unit 130 determines that the no adjustment of the substrate W is required. In this case, the control unit 130 executes the bevel process (Step S5) without executing the position adjustment process (Step S4) described later.

Figure 9:
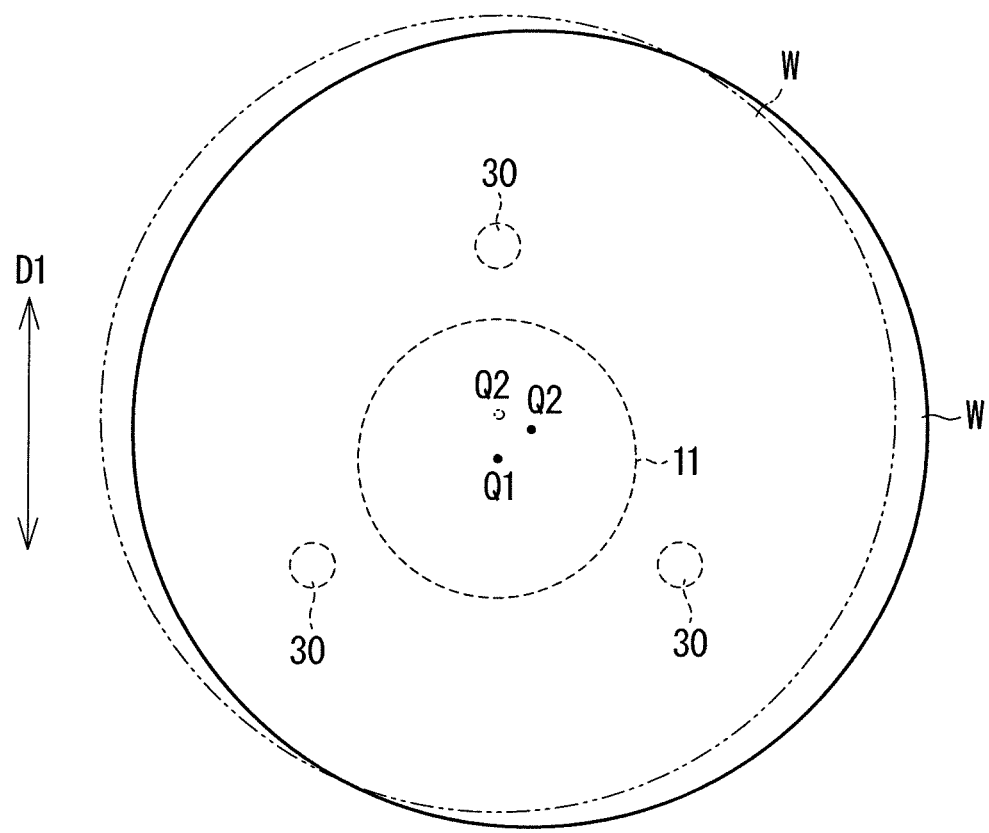
FIG. 9 A plan view schematically illustrating an example of a configuration a substrate.

On the other hand, when the eccentric amount is greater than the reference value, the substrate W is eccentric, and the control unit 130 determines that the position adjustment process of the substrate W is required. FIG. 9 is a plan view schematically illustrating an example of a configuration the substrate W. In the example of FIG. 9, the center Q2 of the substrate W is deviated from the rotation axis Q1. Specifically, the center Q2 of the substrate W is deviated diagonally upward to the right of the drawing sheet with respect to the rotation axis Q1. In this case, the control unit 130 determines that the position adjustment process of the substrate W is required, and executes the position adjustment process of the substrate W (Step S4).

Figure 10:
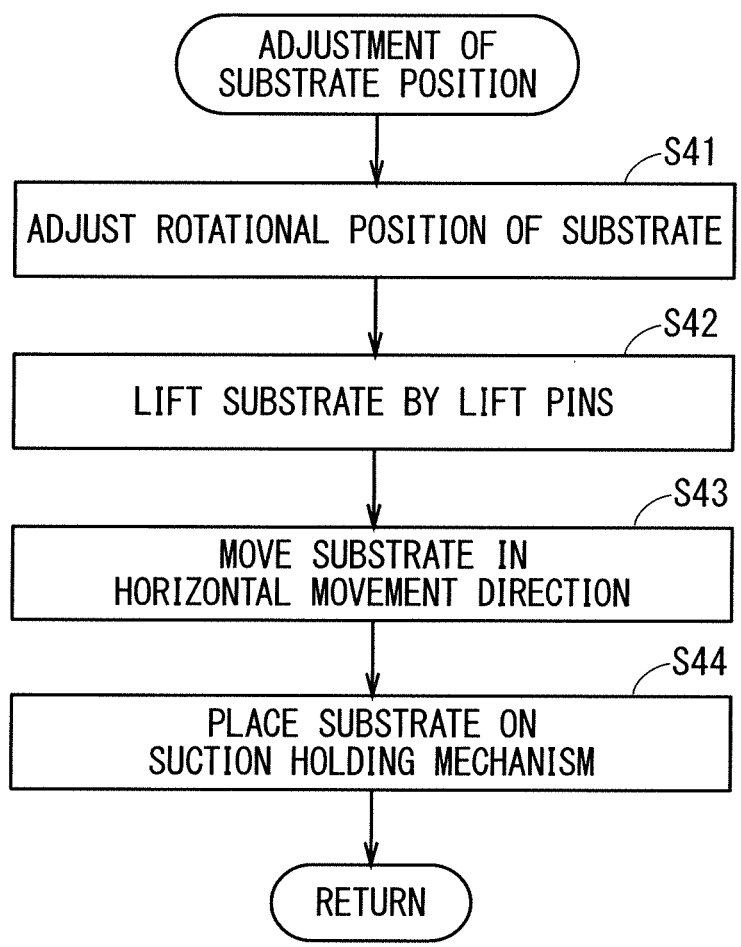
FIG. 10 A flowchart illustrating a specific example of a position adjustment process for the substrate.

FIG. 10 is a flowchart illustrating a specific example of the position adjustment process for the substrate W. First, the rotation mechanism 20 rotates the substrate W so that the eccentric direction of the substrate W is along the horizontal movement direction D1 (see also FIG. 9) by the horizontal movement mechanism 50 (Step S41). In the example of FIG. 9, the two-dot chain line represents the substrate W after the rotation. In the example of FIG. 9, the center Q2 of the substrate W after the rotation is aligned with the rotation axis Q1 in the horizontal movement direction D1.

Next, the lift pins 30 lift the substrate W from the suction holding mechanism 10 (Step S42). Specifically, the suction mechanism 16 stops the suction of gas to release the adsorption of the substrate W, and then the vertical movement mechanism 40 moves the plurality of lift pins 30 from the lower position to the upper position. Due to this movement, the plurality of lift pins 30 receive the substrate W from the suction holding mechanism 10 and lift the substrate W. Therefore, the substrate W is supported by the plurality of lift pins 30.

Next, the horizontal movement mechanism 50 moves the substrate W along the horizontal movement direction D1 in a direction in which the eccentric amount of the substrate W is reduced (Step S43). In the example of FIG. 9, the substrate W after the rotation is moved downward in the drawing sheet. As the movement amount of the substrate W, the eccentric amount of the substrate W measured by the sensor 60 may be adopted. As a result, ideally, the center Q2 of the substrate W coincides with the rotation axis Q1 in plan view.

Next, the lift pins 30 place the substrate W on the suction surface 11a of the suction holding mechanism 10 (Step S44). Specifically, the vertical movement mechanism 40 moves the lift pins 30 from the upper position to the lower position. As a result of this movement, the substrate W is placed on the suction surface 11a of the suction holding mechanism 10 again. Next, the horizontal movement mechanism 50 may move the lift pins 30 to the original position in the horizontal movement direction D1.

As described above, with the eccentric amount of the substrate W reduced, the lift pins 30 moves to the lower position and the substrate W is placed on the suction surface 11a, so that the suction holding mechanism 10 suctions and holds the substrate W with a small eccentric amount.

Next, the control unit 130 executes the bevel process (Step S5). Specifically, the nozzle moving mechanism 95 moves the nozzle 91 and the rinsing nozzle to the processing positions, and the guard moving mechanism 97 moves the guard 96 from the lower position to the upper position. Next, the rotation mechanism 20 rotates the substrate W at a rotation speed suitable for bevel processing. Next, when the valve 93 opens, the chemical solution is supplied from the nozzle 91 to the peripheral edge portion of the substrate W, and impurities in the peripheral edge portion of the substrate W are removed. When the impurities are sufficiently removed, the valve 93 closes and the rinsing valve opens. Accordingly, the rinsing solution is supplied from the rinsing nozzle to the peripheral edge portion of the substrate W. The rinsing solution washes away the chemical solution on the peripheral edge of the substrate W. In other words, the chemical solution on the peripheral edge portion of the substrate W is replaced with the rinse solution. When the chemical solution has been sufficiently washed away, the rinsing valve closes. Next, in order to dry the substrate W, the rotation mechanism 20 increases the rotation speed of the substrate W and rotates the substrate W at a rotation speed suitable for drying (so-called spin drying). When the drying process is completed, the rotation mechanism 20 ends the rotation of the substrate W.

Next, the processed substrate W is conveyed out (Step S6). Specifically, the suction mechanism 16 releases the suction of the substrate W, and the center robot CR receives the substrate W from the suction holding mechanism 10 to convey the substrate W to the outside.

As described above, according to the substrate processing apparatus 1, the eccentric amount of the substrate W is reduced. Therefore, the bevel processing on the substrate W with a small eccentric amount is executable. And this reduces the potentiality that the chemical solution enters the device region of the substrate W.

Moreover, according to the substrate processing apparatus 1, with the lift pins 30 lifting the substrate W, the lift pins 30 and the substrate W are integrally moved along the horizontal movement direction D1 to reduce the eccentric amount of the substrate W. Therefore, as compared with the case where the substrate W is placed on the suction surface 11a and the substrate W is slid horizontally with respect to the suction holding mechanism 10, as in Patent Documents 1 and 2, scraping between the substrate W and the suction surface 11a is avoidable. Therefore, the damage to or contaminate the lower surface of the substrate W by the scraping is reduced.

Further, according to the above example, the pin movement mechanism (vertical movement mechanism 40 and horizontal movement mechanism 50) that moves the lift pins 30 is provided in the motor storing member 70. The motor storing member 70 is located directly below the suction holding mechanism 10; therefore, the pin movement mechanism is allowed to be provided near the substrate W. In the example of FIG. 3, the pin movement mechanism is provided on the upper surface portion 71 of the motor storing member 70. According to the configuration, the pin movement mechanism is allowed to be arranged closer to the substrate W. According to the configuration, the pin movement mechanism adjusts the position of the substrate W near the substrate W, the accuracy of the position adjustment of the substrate W is improved. For example, the position of the substrate W is adjusted with higher accuracy than when the center robot CR adjusts the position of the horizontal plane of the substrate W.

Further, in the above example, the pin movement mechanism is coupled to the motor storing member 70, which is a non-driving body fixed to the floor surface of the substrate processing apparatus 1. That is, no other driving body is interposed between the pin movement mechanism and the motor storing member 70 (non-driving body). Therefore, the position of the substrate W is adjusted with higher accuracy than when the adjustment mechanism that adjusts the position of the substrate in the horizontal plane is coupled to a driving body such as the guard 96. That is, when the adjustment mechanism is coupled to a driving body such as the guard 96, a constant minute displacement in the driving body may affect the adjustment mechanism and cause an error in the position adjustment of the adjustment mechanism. On the other hand, when the pin movement mechanism is coupled to a non-driving body (for example, the motor storing member 70), such an error is avoidable.

Further, in the above example, the pin movement mechanism (vertical movement mechanism 40 and horizontal movement mechanism 50), the coupling member 31 and the lift pins 30 required for adjusting the position of the substrate W are located on the rotation axis Q1 side rather than the peripheral edge portion of the board W in plan view. Therefore, the space outside the substrate W is used for arranging other members, in plan view.

Further, in the above example, the plurality of lift pins 30 are coupled by the coupling members 31 and move integrally by the pin movement mechanism. Therefore, the pin movement mechanism can be downsized as compared with the case where the pin movement mechanism is individually provided for each lift pin 30.

<Position of Lift Pins>

The lift pins 30 may preferably be located in an area described below in plan view. Specifically, a plurality of lift pins 30 are preferably located in an annular region interposed between a virtual inner circle having a diameter of one-fourth of the diameter of the substrate W and a virtual outer circle having a diameter of three-quarters of the diameter of the substrate W.

For comparison, an examination is made about the case where the lift pins 30 are located on the peripheral edge of the substrate W in plan view. In this case, the lift pins 30 support the peripheral edge of the lower surface of the substrate W. Therefore, the distance between the support points that support the substrate W (that is, the peripheral edge of the substrate) and the central portion of the substrate W is relatively long. Therefore, with the lift pins 30 lifting the substrate W, the central portion of the substrate W bends significantly downward with respect to the support points. When the substrate W is greatly bent in this manner, this raises the possibility that the substrate W may be displaced in the horizontal direction with respect to the suction surface 11a when the substrate W is placed on the suction surface 11a of the suction holding mechanism 10.

Whereas, when the lift pins 30 are located in the annular region above, the distance between the support points of the substrate W by the lift pins 30 and the central portion of the substrate W is reduced. Therefore, the bending amount of the substrate W is reduced. Therefore, the positional deviation of the substrate W that occurs when the substrate W is placed on the suction surface 11a is reduced.

<Positional Relationship Between Lift Pins and Suction Holding Mechanism>

Figure 11:
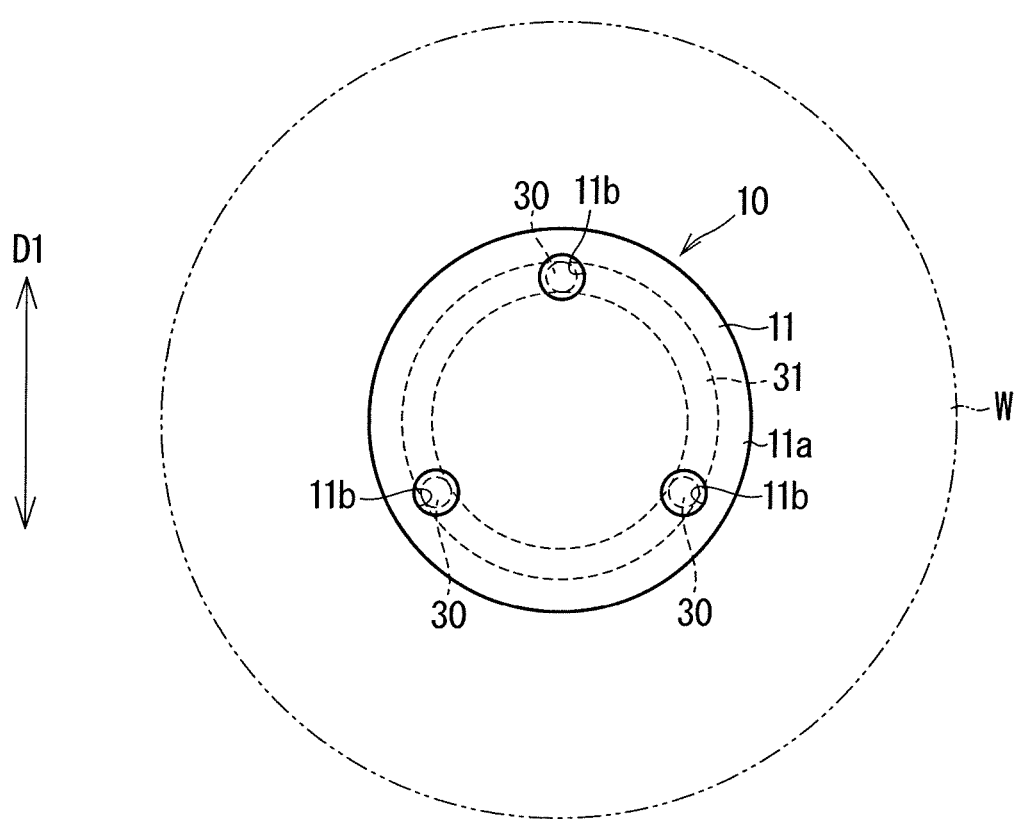
FIG. 11 A plan view schematically illustrating another example of the configuration of the suction holding mechanism and the lift pins.

In the above example, the lift pins 30 are located radially outside the suction holding mechanism 10 (suction member 11). However, this is not the only case to be applied. FIG. 11 is a plan view schematically illustrating another example of the configuration of the suction holding mechanism 10 and the lift pins 30. A through hole 11b is formed in the suction member 11 of the suction holding mechanism 10 at a position facing the lift pin 30. The through hole 11b extends through the suction member 11 (more specifically, the plate-shaped member 12) in the vertical direction. The through hole 11b is formed so as not to interfere with the suction internal flow path formed in the suction member 11. The through hole 11b is larger than the lift pin 30 in plan view, and the lift pin 30 is movable along the horizontal movement direction D1 with the lift pin 30 penetrating the through hole 11b. The size of the through hole 11b is set so as to secure the movable range of the lift pin 30.

Figure 12:
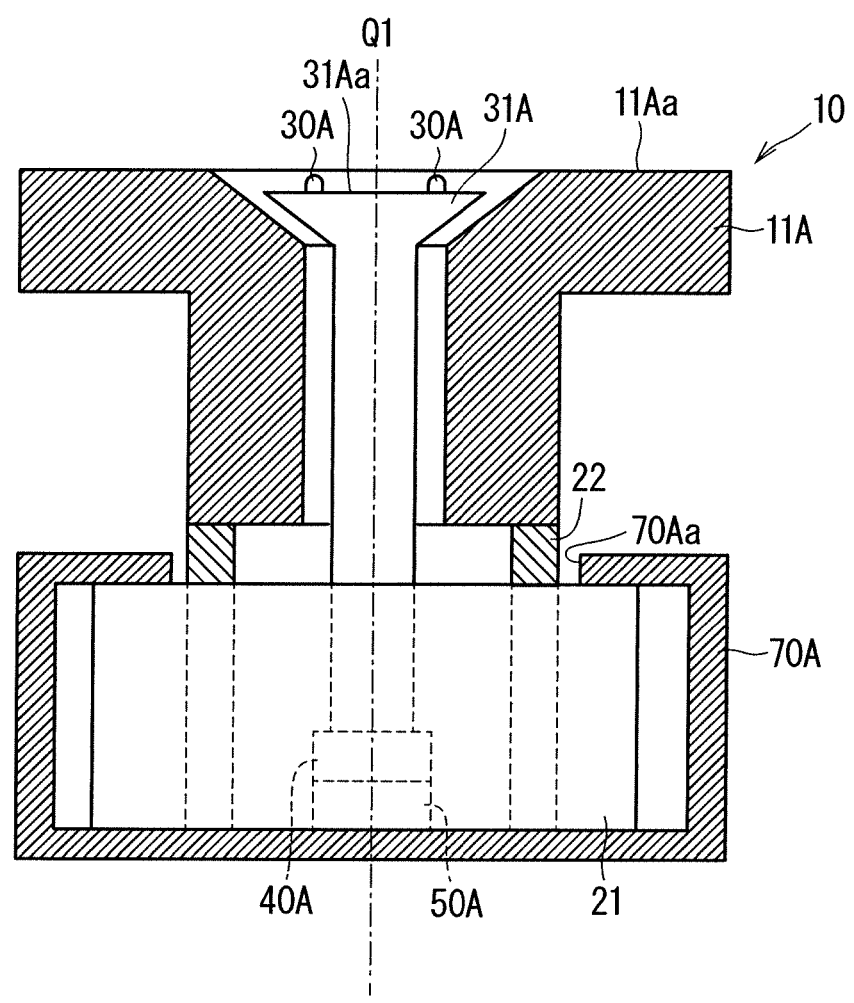
FIG. 12 A plan view schematically illustrating another example of the configuration of the suction holding mechanism and the lift pins.

FIG. 12 is a plan view schematically illustrating another example of the configuration of the suction holding mechanism 10. The suction holding mechanism 10 includes a suction member 11A. The suction member 11A has a cylindrical shape surrounding the rotation axis Q1. Therefore, the suction surface 11Aa of the suction member 11A has an annular shape in plan view. The substrate W is placed on the suction surface 11Aa of the suction member 11A. The outer diameter of the suction surface 11Aa is smaller than, for example, the diameter of the substrate W. A suction port (not illustrated) is formed on the suction surface 11Aa. An internal flow path connected to the suction port is formed in suction member 11A, and the internal flow path is connected to a suction mechanism (not illustrated) via a suction tube (not illustrated). When the suction mechanism sucks the gas, the back surface of the substrate W is sucked onto the suction surface 11Aa of the suction member 11A. Consequently, the substrate W is sucked and held by the suction member 11A.

The lower end of the suction member 11A is coupled to the motor 21 via the shaft 22. By rotating the shaft 22 by the motor 21, the suction member 11A rotates about the rotation axis Q1. The shaft 22 is a hollow shaft.

The motor 21 is stored in a motor storing member 70A. A through hole 70Aa penetrated by the shaft 22 is formed in the upper surface portion of the motor storing member 70A. A seal bearing (not illustrated) may be provided in the through hole 70Aa. The shaft 22 is rotatably coupled to the motor storage member 70A.

In FIG. 12, the substrate processing apparatus 1 is provided with a plurality of pins 30A. The plurality of pins 30A are stand on an upper surface 31Aa of a lift member 31A. The plurality of pins 30A are arranged at equal intervals on a virtual circle centered on the rotation axis Q1. For example, three pins 30A are arranged at 120 degree intervals. Each pin 30A projects upward from the upper surface 31Aa. The lift member 31A functions as a coupling member for coupling the plurality of pins 30A.

The lift member 31A extends in the vertical direction in the hollow portion of the suction member 11A and the shaft 22. Therefore, the plurality of pins 30A are located on the rotation axis Q1 side rather than the suction surface 11Aa of the suction member 11A in a plan view.

The plurality of pins 30A are movable in the vertical direction by a vertical movement mechanism 40A. In the example of FIG. 12, the vertical movement mechanism 40A moves the lift member 31A in the vertical direction to integrally move the plurality of pins 30A in the vertical direction. The vertical movement mechanism 40A moves the lift member 31A between the upper position and the lower position. The upper position is the position where the upper ends of the pins 30A are above the suction surface 11Aa, and the lower position is the position where the upper ends of the pins 30A are below the suction surface 11Aa. The configuration of the vertical movement mechanism 40A is the same as that of the vertical movement mechanism 40. The pins 30A move in the vertical direction allows; therefore, they can be said to be lift pins.

The vertical movement mechanism 40A moves the lift member 31A from the lower position to the upper position, so that the plurality of pins 30A come into contact with the back surface of the substrate W to lift the substrate W. Accordingly, the substrate W is supported by the plurality of pins 30A.

The plurality of pins 30A are movable in the horizontal direction by a horizontal movement mechanism 50A. In the example of FIG. 12, the horizontal movement mechanism 50A moves the vertical movement mechanism 40A in the horizontal direction to integrally move the plurality of pins 30A in the horizontal direction. With the plurality of pins 30A lifting the substrate W, the plurality of pins 30A move in the horizontal movement direction, so that the substrate W also moves in the horizontal movement direction. The movable distance of the plurality of pins 30A in the horizontal moving direction is defined by the size of the lift member 31A in plan view, the size of the hollow portion of the suction member 11A, and the size of the hollow portion of the shaft 22. This movable distance need only be set to a value sufficient to cancel the eccentric state of the substrate W in advance.

In the example of FIG. 12, the horizontal movement mechanism 50A is coupled to the lower surface portion of the motor storying member 70A. The motor storing member 70A is a non-driving body (in other words, a fixed body). That is, the pin movement mechanism (vertical moving mechanism 40A and horizontal moving mechanism 50A) that moves the plurality of pins 30A is coupled to the non-driving body. More specifically, the pin movement mechanism is coupled to the non-driving body without interposing another driving body. Therefore, the pin movement mechanism adjusts the position of the substrate W with high accuracy. When the motor storing member 70 does not have a lower surface portion and the lower end peripheral edge of the lower end portion thereof is coupled to the floor surface of the substrate processing apparatus 1, the pin movement mechanism (vertical movement mechanism 40A and horizontal movement mechanism 50A) may be directly coupled to the floor surface of the substrate processing apparatus 1. For example, the positional relationship between the vertical movement mechanism 40A and the horizontal movement mechanism 50A may be reversed.

<Lift Pin Suction Mechanism>

Figure 13:
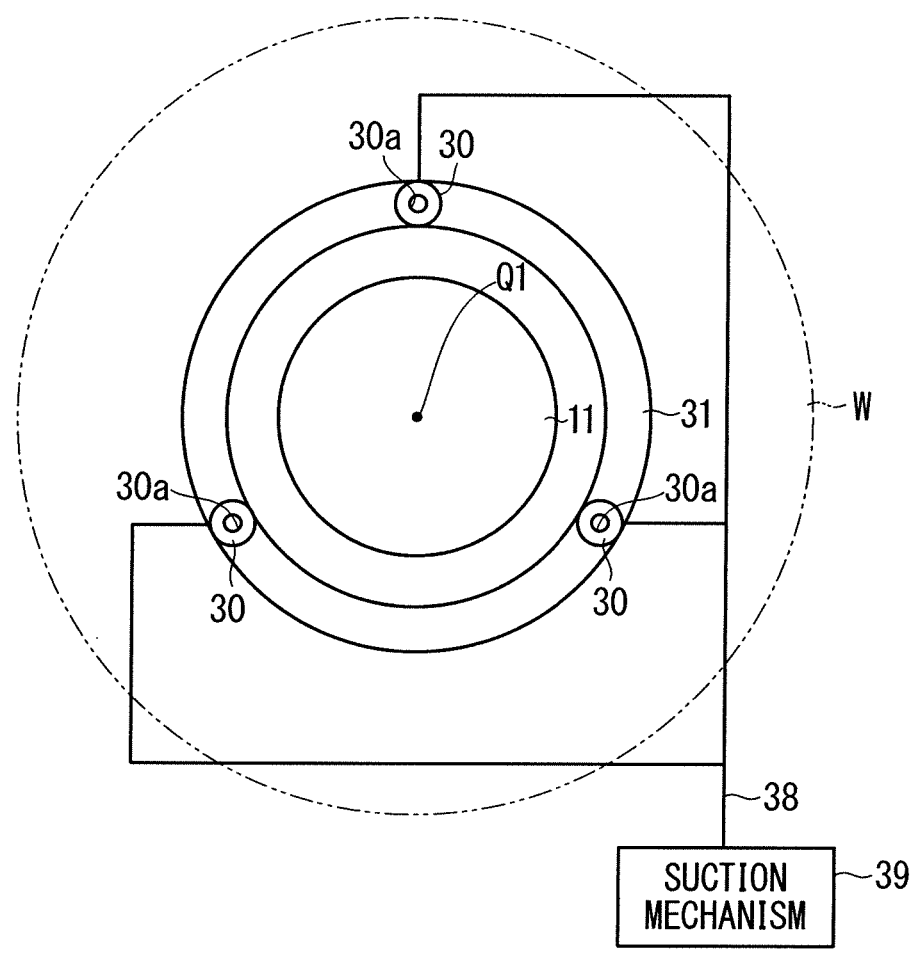
FIG. 13 A plan view schematically illustrating an example of a configuration of the lift pins.

A suction port may be formed at the upper end of at least one of the plurality of lift pins 30. FIG. 13 is a plan view schematically illustrating an example of the lift pins 30. In the example of FIG. 13, all three lift pins 30 have a suction port 30a. The upper end surface of each lift pin 30 is parallel to the lower surface of the substrate W, and the suction port 30a is formed on the upper end surface of the lift pin 30. An internal flow path connected to the suction port 30a is formed in the lift pin 30, and the internal flow path is connected to the suction mechanism 39 via a suction tube 38. The suction tube 38 is flexible and deforms in response to the movement of the lift pin 30. The suction mechanism 39 includes a pump and sucks gas from the inside of the suction tube 38. Consequently, gas is sucked from the suction port 30a. The suction mechanism 39 is controlled by the control unit 130.

The substrate W is sucked and held by the lift pins 30 by the suction mechanism 39 sucking the gas in a state where the plurality of lift pins 30 move to the upper position to support the substrate W. This reduces the potential positional deviation between the lift pins 30 and the substrate W due to the movement of the lift pins 30.

<Positional Adjustment of Substrate>

Figure 14:
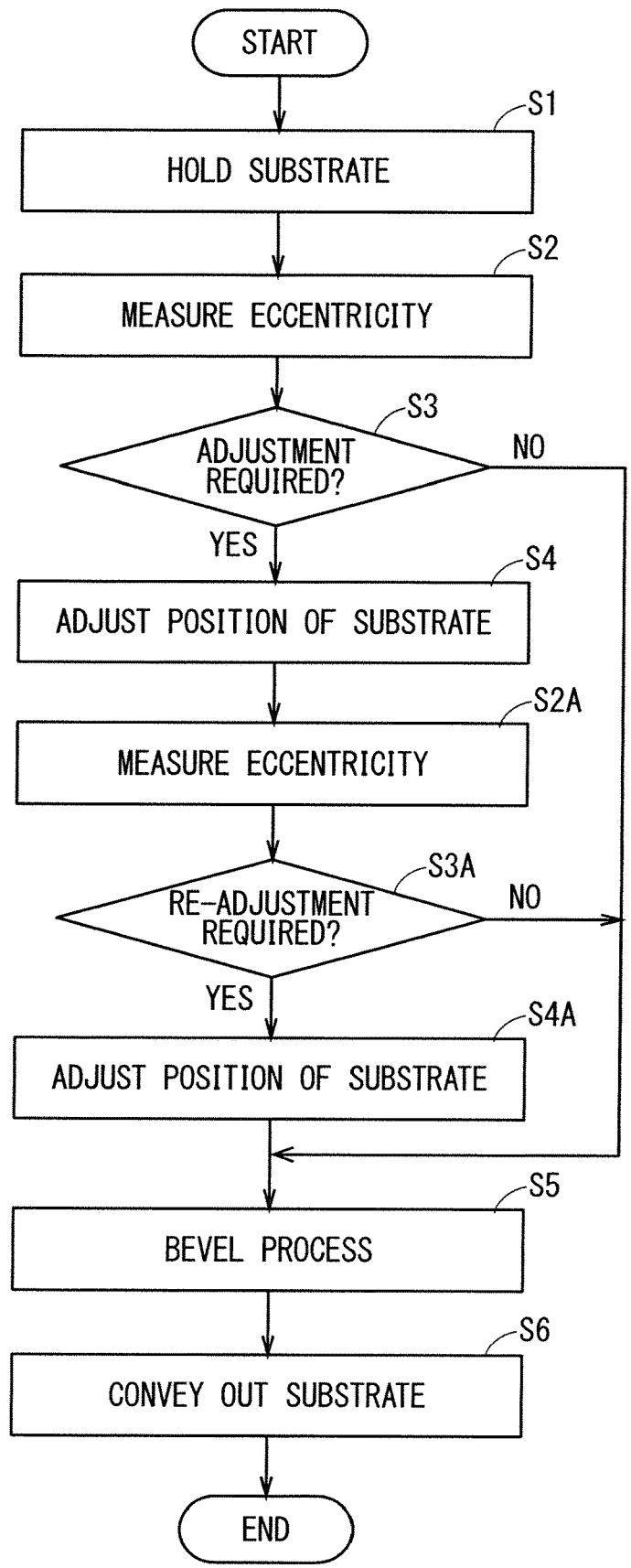
FIG. 14 A flowchart illustrating another example of the operation of the substrate processing apparatus 1.

After adjusting the position of the substrate W, the eccentric state of the substrate W may be checked again. FIG. 14 is a flowchart illustrating another example of the operation of the substrate processing apparatus 1. First, the untreated substrate W is conveyed in and is sucked and held by the suction holding mechanism 10 (Step S1). Next, the sensor 60 measures the eccentric state of the substrate W (Step S2), the control unit 130 determines the necessity of the position adjustment process of the substrate W (Step S3), and the control unit 130 executes the position adjustment process of the substrate W depending on the necessary (Step S4).

When the position adjustment process of the substrate W is completed, the sensor 60 measures the eccentric state again (Step S2A). That is, the control unit 130 checks whether or not the eccentric state of the substrate W has been appropriately cancelled by the position adjustment process of the substrate W in Step S3. The specific process of Step S2A is the same as that of Step S2.

Next, the control unit 130 determines whether or not the position adjustment process of the substrate W is required (Step S3A). The specific process of Step S3A is the same as that of Step S3. When the eccentric amount is smaller than the reference value, the eccentric state of the substrate W has been cancelled by the position adjustment process in Step S3. Therefore, the control unit 130 determines that the position adjustment process is not required to execute again, and performs the bevel process in Step S5.

On the other hand, when the eccentric amount is greater than the reference value, the control unit 130 determines that the position adjustment process is required to execute again, and executes the position adjustment process of the substrate W again (Step S4A). The specific processing of step S4A may be the same as that of Step S4, for example. Next, the control unit 130 executes the bevel process (Step S5). After the bevel processing, the processed substrate W is conveyed out from the substrate processing apparatus 1 (Step S6).

According to the above operation, the eccentric state of the substrate W is measured again after the first position adjustment process of the substrate W, and the position adjustment process of the substrate W is performed again depending on the measurement result. Therefore, the eccentric amount of the substrate W is reduced more appropriately.

In the above example, although the position adjustment process is performed twice as necessary, the times to perform the position adjustment process are not necessarily limited to two. The control unit 130 may repeatedly perform the position adjustment process of the substrate W until the eccentric amount of the substrate W falls below the reference value.

Further, in the adjustment processes of the substrate W from the second time onwards, it may not be that the eccentric amount measured immediately before is adopted, but a value obtained by correcting the eccentric amount may adopted as the movement amount of the substrate W in the horizontal movement direction D1. For example, an assumption is made where the eccentric directions of the substrate W measured immediately before (Step S2) and immediately after (Step S2A) the position adjustment process of Step S4 are opposite to each other, and the eccentric amounts of the substrate W measured immediately before and immediately after the position adjustment are 1 mm and 0.2 mm, respectively. The numbers are not actual ones but are the values exaggerated for the sake of explanation.

In this case, it can be considered that an error of 0.2 mm occurs according to the movement amount of 1 mm in the horizontal movement direction. That is, it can be considered that a 20% error (0.2 mm) occurs with respect to the movement of 1 mm in the position adjustment process of Step S4. In other words, it can be considered that the actual movement amount is 1.2 mm, which is the value 20% added to the set movement amount of 1 mm.

Therefore, the movement amount of the substrate W in Step S4A may be obtained based on the ratio of the eccentric amount measured in Step S2A to the eccentric amount measured in Step S2. In other words, if the substrate W moves with the additional 20%, as the movement amount of Step S4A, $0.16\{=(0.2)\cdot(1-0.2/1)\}$ mm is adopted, in which the value is reduced by 20%. As a result, the eccentric state of the substrate W is more appropriately canceled by the position adjustment process in Step S4A.

Further, the control unit 130 may store, in the storage medium 132 as a database, the eccentric amount before and after the position adjustment process each time, and determine the movement amount of the substrate W in the position adjustment process from the next time onward based on the database.

Second Embodiment

The configuration of the substrate processing apparatus 1 according to the second embodiment is the same as that of the first embodiment except for the configuration of the sensor 60. In the second embodiment, the sensor 60A is provided in place of the sensor 60. However, the second embodiment does not necessarily presuppose the first embodiment, and the sensor 60A is appropriately adoptable to other substrate processing apparatuses.

FIG. 15 is a diagram schematically illustrating an example of a configuration of the sensor 60A. In the example of FIG. 15, the sensor 60A is located at the measurement position and faces the peripheral edge portion of the substrate W. In the example of FIG. 15, the sensor 60A includes a light emitting unit 61, a light receiving unit 62, and an optical path changing element 64. Hereinafter, the light emitting unit 61, the light receiving unit 62, and the optical path changing element 64 when the sensor 60A is located at the measurement position will be described. The light emitting unit 61 irradiates the peripheral edge portion of the substrate W with the light L1 at the measurement position, as in the first embodiment. The light emitting unit 61 is located above with respect to the surface of the substrate W.

In the second embodiment, the light receiving portion 62 is also located above with respect to the surface of the substrate W. The light receiving unit 62 is adjacent to and does not overlap the light emitting unit 61 and the substrate W in a plan view. In the example of FIG. 15, the light receiving unit 62 is located radially outside the light emitting unit 61 and is radially aligned with the light emitting unit 61. The light receiving unit 62 may be adjacent to the light emitting unit 61 in the circumferential direction of the rotation axis Q1.

The optical path changing element 64 changes the course of the light L11 of the light L1 that has passed through the outside of the substrate W emitted from the light emitting unit 61, and causes the light L11 to travel toward the light receiving unit 62. That is, the light receiving unit 62 receives the light L11 of the light L1 that has passed outside the substrate W via the optical path changing element 64. The optical path changing element 64 is, for example, a prism. This optical path changing element 64 has higher chemical resistance than that of the light emitting unit 61 and the light receiving unit 62. For example, the prism is made of quartz or sapphire glass. The optical path changing element 64 may be composed of a plurality of mirrors.

The light emitting unit 61, the light receiving unit 62, and the optical path changing element 64 may be coupled to each other by coupling members (not illustrated). According to the configuration, the sensor movement mechanism 65 integrally moves the light emitting unit 61, the light receiving unit 62, and the optical path changing element 64.

The algorithm for measuring the eccentric state of the substrate W by the sensor 60A is the same as that of the first embodiment.

According to the second embodiment, the light emitting unit 61 and the light receiving unit 62 are provided above the substrate W, and the optical path changing element 64 is provided below the substrate W. The treatment liquid may adhere to the member below the substrate W, or an atmosphere containing a large amount of volatile components of the treatment liquid (for example, a chemical solution) may be formed in the space below the substrate W. If the light emitting unit 61 or the light receiving unit 62 is provided below the substrate W, the treatment solution or the volatile component may adhere to and corrode the light emitting unit 61 or the light receiving unit 62. This lowers the measurement accuracy of the sensor 60.

Meanwhile, in the second embodiment, the light emitting unit 61 and the light receiving unit 62 are located above the substrate W, so that the treatment solution or the volatile component is unlikely to adhere. Therefore, the inconvenience associated with the adhesion of the treatment solution or the volatile component to the light emitting unit 61 and the light receiving unit 62 is unlikely to occur.

In the example of FIG. 15, the light emitting portion 61 and the light receiving portion 62 are covered with a protective member 66 having a high chemical resistance. Of the protective member 66, at least a portion that faces the emitting surface of the light emitting unit 61 and a portion that faces the light receiving surface of the light receiving unit 62 have translucency with respect to the light L1. The light emitting surface is a surface facing the light source, and the light L1 emitted by the light source transmits therethrough. The light receiving surface is a surface facing the light receiving element and is the surface through which the light L11 transmits. Examples of the material constituting the protective member 66 include, for example, a fluorine-based resin.

The light emitting unit 61 and the light receiving unit 62 are located above the substrate W; therefore, even if the protective member 66 is provided for the light emitting unit 61 and the light receiving unit 62, a space-wise problem is less likely to occur compared with the case where the light emitting unit 61 or the light receiving unit 62 is located below the substrate W. The reasons therefor will be briefly described in the following. In the space below the substrate W, another member such as a heater that heats the peripheral edge portion of the substrate W over the entire circumference may be provided. The heater has an annular shape in plan view, and faces the peripheral edge portion of the substrate W on substantially the entire circumference. On the other hand, in the space above the peripheral edge portion of the substrate W, a member larger than the space below is not provided. Therefore, in terms of space, the light emitting unit 61 and the light receiving unit 62 are easily covered with the large protective member 66.

On the other hand, when the optical path changing element 64 has higher chemical resistance than those of the light emitting unit 61 and the light receiving unit 62, the optical path changing element 64 may not be provided with the protective member. Alternatively, the protective member may also be appropriately provided with the optical path changing element 64. The optical path changing element 64 has a simpler structure than those of the light emitting unit 61 and the light receiving unit 62; therefore, manufacturing of the thinner optical path changing element 64 than the light emitting unit 61 and the light receiving unit 62 is facilitated. Therefore, even if the protective member is provided with the optical path changing element 64 located below the substrate W, a space-wise problem is unlikely to occur.

Although the substrate processing apparatus 1 has been described in detail, the foregoing description is in all aspects illustrative and not restrictive to the substrate processing apparatus 1. It is understood that numerous other modifications can be devised without departing from the scope of the disclosure. It should be noted that the configurations of the embodiments and modifications can be arbitrarily combined and can be appropriately modified or omitted without departing from the scope of the disclosure.

For example, in the first embodiment, the sensor 60 may include a camera. The camera may photograph an image of the substrate W held by the suction holding mechanism 10 to acquire image data, and the control unit 130 may perform image processing on the image data to specify the center of the substrate W.

Further, in the first and second embodiments, when the lift pins 30 have the suction ports 30a, the lift pins 30 may be provided above the substrate W. In this case, the lift pins 30 are arranged with the suction ports 30a facing the surface of the substrate W. The lift pins 30 suck and hold the substrate W by sucking gas from the suction ports 30a in a state where the lift pins 30 move to the lower position and the suction ports 30a is in contact with the surface of the substrate W. In this state, the lift pins 30 may move to the upper position to lift the substrate W, move in the horizontal movement direction, and then move to the lower position to deliver the substrate W to the suction holding mechanism 10.

EXPLANATION OF REFERENCE SIGNS 1 substrate processing apparatus
10 suction holding mechanism
20 rotation mechanism
30, 30A lift pin
40, 40A vertical movement mechanism
50, 50A horizontal movement mechanism
60 sensor
70 storing member (motor storing member)

The invention claimed is:

1. A substrate processing apparatus for processing a substrate, comprising:
    a suction holder configured to suck a back surface of the substrate and hold the substrate horizontally;
    a first motor coupled to the suction holder via a shaft and configured to rotate the suction holder holding the substrate about a rotation axis passing through a center of the substrate in a vertical direction;
    a plurality of lift pins provided in positions opposite to the substrate below the substrate held by the suction holder;
    a second motor coupled to the plurality of lift pins via a plate and configured to move upper ends of the plurality of lift pins between a first position being higher than a suction surface of the suction holder and a second position being lower than the suction surface of the suction holder;
    a third motor coupled to the plurality lift pins via the plate and configured to move the plurality of lift pins in a horizontal direction with respect to the suction holder;
    a sensor configured to measure an eccentric state of the substrate held by the suction holder,
    a first box configured to store the first motor; and
    a second box configured to store the second motor and the third motor, wherein
    the second motor is configured to support the substrate from the suction holder by moving the plurality of lift pins to the first position,
    the third motor is configured to move the plurality of lift pins based on the eccentric state of the substrate measured by the sensor in a state where the substrate is supported,
    the first motor is coupled to the shaft extending downward from the suction holder, the second motor and the third motor are coupled to the second box, the second motor and the third motor are provided on an upper surface portion of the first box, the second box includes an inner peripheral wall connected to the upper surface portion of the first box, an outer peripheral wall surrounding the inner peripheral wall and an upper surface positioned above the second motor and the third motor and connected to the inner peripheral wall and the outer peripheral wall, the upper surface of the second box has a first through hole through which the plurality of lift pins can penetrate, and a seal is provided between the upper surface of the second box and the plurality of lift pins that seals the first trough hole.

2. The substrate processing apparatus according to claim 1, wherein the plurality of lift pins are coupled to each other and integrally move.

3. The substrate processing apparatus according to claim 1, wherein the plurality of lift pins are arranged at equal intervals on a virtual circle centered on the rotation axis.

4. The substrate processing apparatus according to claim 1, wherein the plurality of lift pins located in an annular region interposed between a virtual inner circle having a diameter of one-fourth of a diameter of the substrate held by the suction holder and a virtual outer circle having a diameter of three-quarters of the diameter of the substrate in plan view.

5. The substrate processing apparatus according to claim 1, wherein the plurality of lift pins are located outside the suction holder in plan view.

6. The substrate processing apparatus according to claim 1, wherein second through holes penetrated by the plurality of lift pins in a vertical direction are formed on the suction holder.

7. The substrate processing apparatus according to claim 1, wherein the suction holder has an annular shape surrounding the rotation axis, and the plurality lift pins are located inside the suction holder in plan view.

8. The substrate processing apparatus according to claim 1, wherein a suction port configured to suck the substrate is formed at the upper end of at least one of the plurality of lift pins.

* * * * *